US007135718B2

(12) United States Patent
Kitada et al.

(10) Patent No.: US 7,135,718 B2
(45) Date of Patent: Nov. 14, 2006

(54) DIODE DEVICE AND TRANSISTOR DEVICE

(75) Inventors: Mizue Kitada, Hanno (JP); Kosuke Ohsima, Hanno (JP); Shinji Kunori, Hanno (JP); Toru Kurosaki, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 10/369,101

(22) Filed: Feb. 20, 2003

(65) Prior Publication Data

US 2003/0160262 A1 Aug. 28, 2003

(30) Foreign Application Priority Data

| Feb. 20, 2002 | (JP) | ............................. 2002-042535 |
| Mar. 1, 2002 | (JP) | ............................. 2002-055242 |
| Apr. 9, 2002 | (JP) | ............................. 2002-105915 |
| Oct. 1, 2002 | (JP) | ............................. 2002-288317 |

(51) Int. Cl.
*H01L 29/76* (2006.01)

(52) U.S. Cl. ...................... 257/170; 257/127; 257/168; 257/173; 257/409; 257/484; 257/605; 257/E29.012

(58) Field of Classification Search ............... 257/127, 257/168, 170, 173, 409, 484, 605, E29.012
See application file for complete search history.

(56) References Cited

U.S. PATENT DOCUMENTS

| 3,335,296 | A | | 8/1967 | Smart ......................... 307/88.5 |
| 3,391,287 | A | | 7/1968 | Kao et al. .................... 307/302 |
| 3,541,403 | A | | 11/1970 | Lepselter et al. ............ 317/234 |
| 4,602,266 | A | * | 7/1986 | Coe ............................. 257/495 |
| 4,754,310 | A | | 6/1988 | Coe ............................. 357/13 |
| 5,017,976 | A | * | 5/1991 | Sugita ......................... 257/494 |
| 5,075,739 | A | * | 12/1991 | Davies ........................ 257/170 |
| 5,081,509 | A | | 1/1992 | Kozaka et al. ................ 357/13 |
| 5,081,510 | A | * | 1/1992 | Ohtsuka et al. ............. 257/473 |
| 5,216,275 | A | | 6/1993 | Chen ........................... 257/493 |
| 5,233,215 | A | * | 8/1993 | Baliga ......................... 257/490 |
| 5,241,195 | A | | 8/1993 | Tu et al. ...................... 257/155 |
| 5,438,215 | A | | 8/1995 | Tihanyi ....................... 257/401 |
| 5,525,821 | A | | 6/1996 | Harada et al. ............... 257/331 |
| 5,608,244 | A | * | 3/1997 | Takahashi .................... 257/267 |
| 5,763,915 | A | * | 6/1998 | Hshieh et al. ............... 257/330 |
| 5,883,411 | A | | 3/1999 | Ueda et al. .................. 257/331 |

(Continued)

FOREIGN PATENT DOCUMENTS

DE 198 20 734 A1 11/1999

(Continued)

OTHER PUBLICATIONS

European Search Report dated Jul. 29, 2004.

(Continued)

*Primary Examiner*—Eugene Lee
(74) *Attorney, Agent, or Firm*—Armstrong, Kratz, Quintos, Hanson & Brooks, LLP

(57) ABSTRACT

A semiconductor device having improved breakdown voltage is provided. A diode device of the present invention includes relay diffusion layers provided between guard ring portions. Therefore, a depletion layer expanded outward from the guard ring portions except the outermost one reaches these relay diffusion layers, and then the outer guard ring portions. The width of the distance between the guard ring portions is shorter where the relay diffusion layers are provided. For the width of the relay diffusion layers, the depletion layer reaches the outer guard ring portions with a lower voltage than the conventional structure.

14 Claims, 13 Drawing Sheets

U.S. PATENT DOCUMENTS

| | | | | |
|---|---|---|---|---|
| 5,962,893 | A | * 10/1999 | Omura et al. | 257/329 |
| 6,069,371 | A | * 5/2000 | Omura et al. | 257/133 |
| 6,084,264 | A | * 7/2000 | Darwish | 257/329 |
| 6,184,545 | B1 | 2/2001 | Werner et al. | 257/109 |
| 6,204,097 | B1 | 3/2001 | Shen et al. | 438/133 |
| 6,236,099 | B1 | * 5/2001 | Boden, Jr. | 257/495 |
| 6,340,836 | B1 | 1/2002 | Shikata | 257/544 |
| 6,404,032 | B1 | 6/2002 | Kitada et al. | 257/471 |
| 6,445,054 | B1 | * 9/2002 | Traijkovic et al. | 257/487 |
| 6,507,050 | B1 | * 1/2003 | Green | 257/170 |
| 6,509,607 | B1 | * 1/2003 | Jerred | 257/330 |
| 6,667,515 | B1 | * 12/2003 | Inoue | 257/341 |
| 6,707,128 | B1 | * 3/2004 | Moriguchi et al. | 257/484 |
| 2001/0052617 | A1 | 12/2001 | Kitada et al. | 257/331 |
| 2003/0042555 | A1 | 3/2003 | Kitada et al. | 257/401 |

FOREIGN PATENT DOCUMENTS

| | | |
|---|---|---|
| EP | 0 124 139 | 11/1984 |
| EP | 0 631 320 | 12/1994 |
| EP | 1 063 705 | 12/2000 |
| EP | 1 076 363 | 2/2001 |
| EP | 1 130 653 A2 | 9/2001 |
| EP | 1 139 433 A1 | 10/2001 |
| EP | 1 289 022 A2 | 3/2003 |
| JP | 2000-312011 | 11/2000 |
| JP | 2001-244462 | 9/2001 |
| JP | 2001-284604 | 10/2001 |
| JP | 2000-077682 | 3/2002 |
| JP | 2003-69017 | 3/2003 |

OTHER PUBLICATIONS

Japanese Office Action issued on Sep. 5, 2006 by the Japanese Patent Office for Japanese Patent application No. 2002-288317.

* cited by examiner

Fig. 15
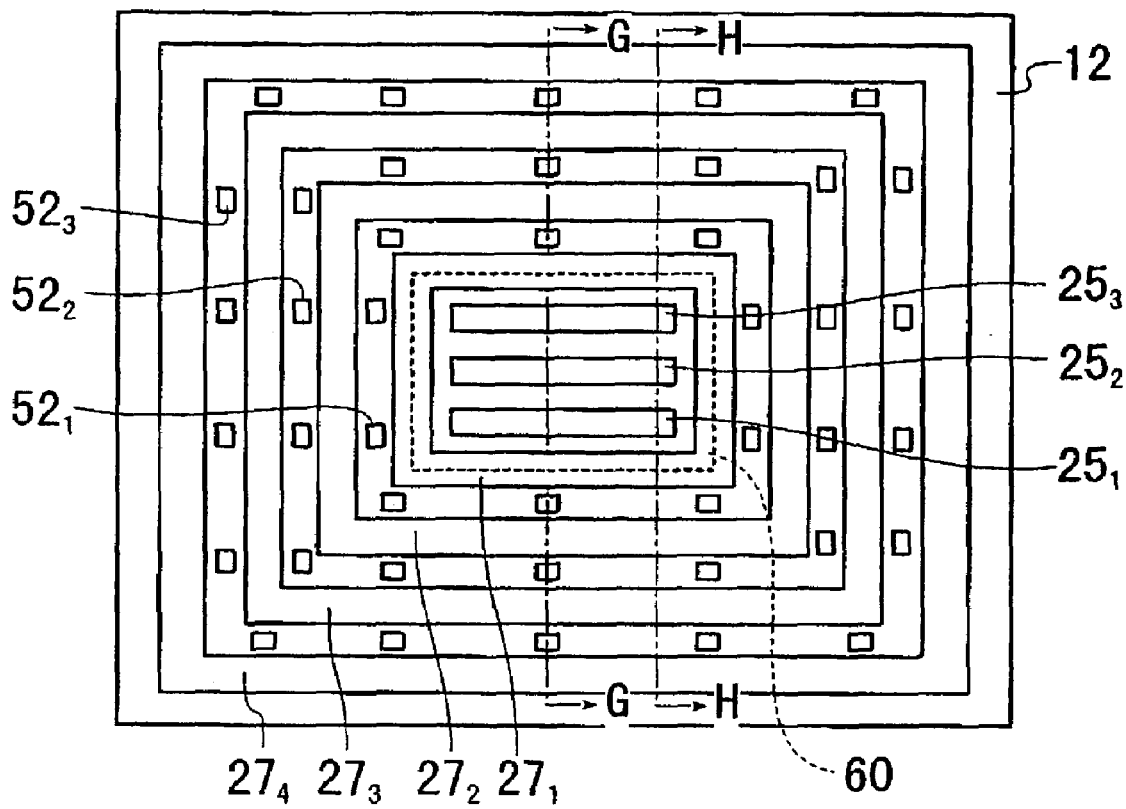
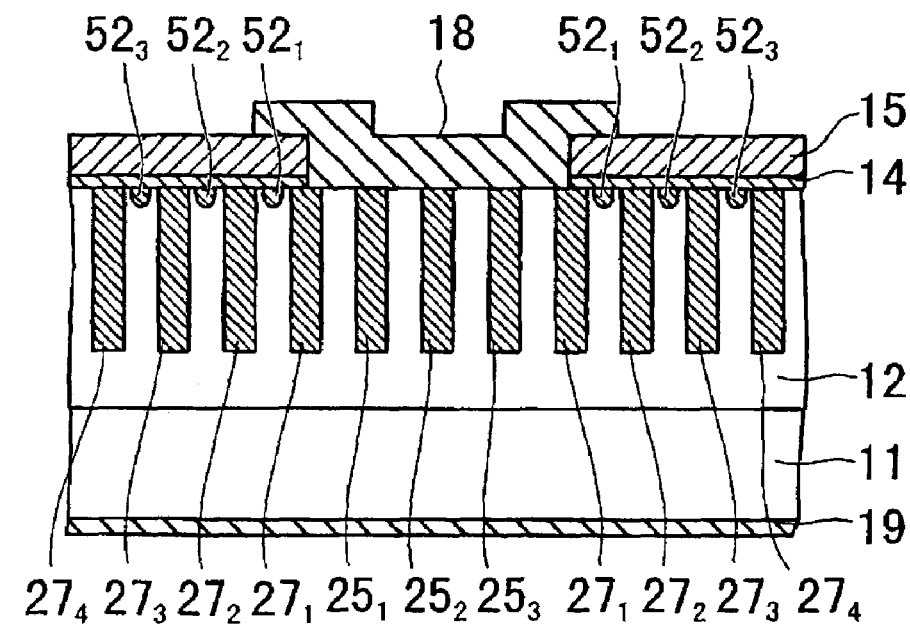
Fig. 16

Fig. 17 PRIOR ART
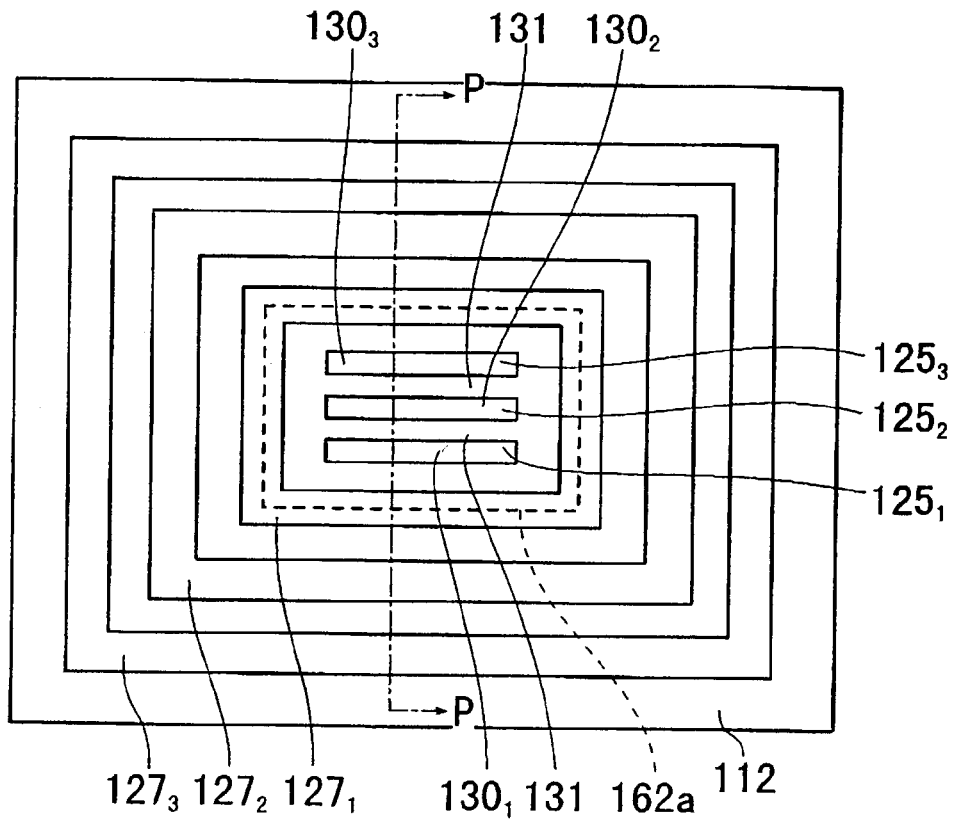
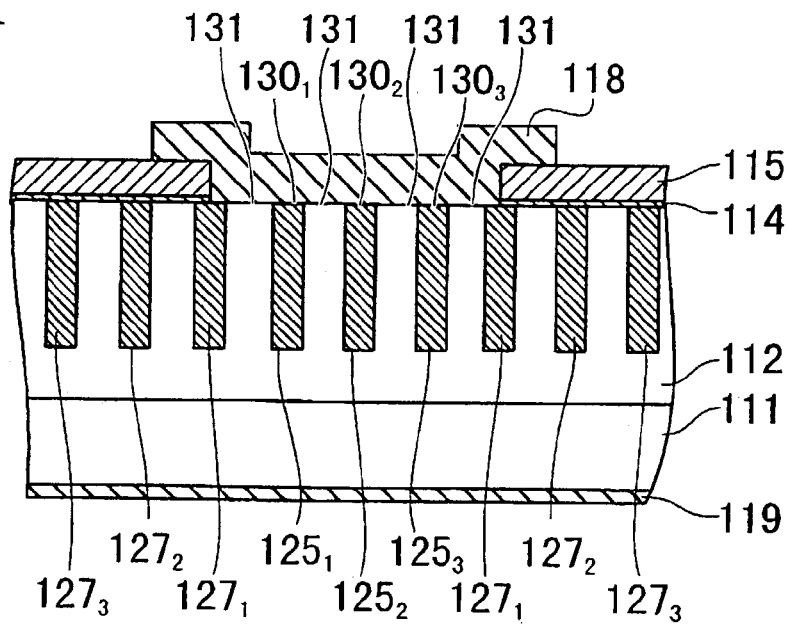
Fig. 18 PRIOR ART

DIODE DEVICE AND TRANSISTOR DEVICE

BACKGROUND OF THE INVENTION

1. Field of the Invention

The present invention relates to semiconductor devices such as diode and transistor, and more particularly, to a semiconductor device having semiconductor crystal epitaxially grown in narrow grooves.

2. Description of the Related Art

FIG. 17 is a plan view of a conventional diode device 101, and FIG. 18 is a sectional view taken along the line P—P in FIG. 17. For the ease of illustration, FIG. 17 does not show a thermal oxide film, a PSG film, and an anode electrode that will be described later.

The diode device 101 has an N-type silicon substrate 111. An N-type epitaxial layer 112 is formed on the surface of the silicon substrate 111.

The surface of the epitaxial layer 112 is provided with ring-shaped holes and oblong holes in plane view. Herein, three ring-shaped holes and three oblong holes are provided. The ring-shaped holes are arranged concentrically at predetermined intervals, and the oblong holes are arranged within the inner circumference of the ring of the innermost ring-shaped hole.

A semiconductor layer formed by epitaxial growth and containing a P-type impurity is filled within the ring-shaped holes and oblong holes. The oblong holes filled with the semiconductor layer form withstanding voltage portions $125_1$ to $125_3$, and the ring-shaped holes filled with the semiconductor layer form guard ring portions $127_1$ to $127_3$.

A thermal oxide film 114 and a PSG film 115 are formed in that order on the surface of the epitaxial layer 112 including inner surface of holes. An anode electrode 118 of a thin metal film is arranged on the PSG film 115. The thermal oxide film 114 and the PSG film 115 are provided with an opening in identical positions. The edge of the opening is denoted by the broken line 162a in FIG. 17. The epitaxial layer 112, the withstanding voltage portions $125_1$ to $125_3$, and the innermost guard ring portion $127_1$ are exposed at the bottom of the opening. These exposed parts are in contact with the bottom of the anode electrode 118. The part of the anode electrode 118 in contact with the epitaxial layer 112 form Schottky junction portions 131. The part of the anode electrode 118 in contact with the withstanding voltage portions $125_1$ to $125_3$ and the innermost guard ring portion $127_1$ form ohmic junction portions $130_1$ to $130_3$.

In the above-described diode device 101, when a negative voltage for the anode electrode 118 is applied to a cathode electrode 119, the Schottky junction portions 131 between the anode electrode 118 and the epitaxial layer 112 are forward biased, which allows current to flow from the anode electrode 118 to the cathode electrode 119.

Conversely, when a positive voltage for the anode electrode 118 is applied to the cathode electrode 119, the Schottky junction portions 131 between the anode electrode 118 and the epitaxial layer 112, and the PN junctions between the withstanding voltage portions $125_1$ to $125_3$ and the innermost guard ring portion $127_1$ and the epitaxial layer 112 are reverse biased, and current is kept from flowing. In this state, a depletion layer is expanded horizontally from the PN junctions toward the epitaxial layer 112.

As the depletion layer expands, the epitaxial layer 112 positioned between the innermost guard ring portion $127_1$ and the withstanding voltage portions $125_1$ to $125_3$ and between the guard ring portions $127_n$ and $127_{n+1}$ adjacent to each other is entirely depleted. At the same time, the guard ring portions $127_1$ to $127_3$ and the withstanding voltage portions $125_1$ to $125_3$ are all depleted inside, in other words, the part within the inner circumference of the ring of the outermost guard ring portion $127_3$ is entirely depleted. Electric field concentration that would occur in an area without a depletion layer does not occur, so that the breakdown voltage improves.

However, in the conventional diode device, breakdown occurs before the part within the inner circumference of the ring of the outermost guard ring portion $127_3$ is entirely depleted.

SUMMARY OF THE INVENTION

The invention is directed to a solution to the above-described disadvantage associated with the conventional device, and it is an object of the invention to provide a high breakdown voltage diode device.

In order to solve the above-described object, the present invention provides a diode device including a semiconductor layer of a first conductivity type having a plurality of holes, the holes including ring-shaped holes and main holes provided in an inner circumferential region of the ring-shaped holes, a filler made of a semiconductor of a second conductivity type filled within the holes, and an electrode film of a material forming a Schottky junction with the semiconductor layer and an ohmic junction with the filler. In the device, among the ring-shaped holes, concentrically provided ring-shaped holes and the filler filled in these holes form a plurality of guard ring portions, the main holes provided in the inner circumferential region of the ring-shaped holes and the filler filled within the main holes form withstanding voltage portions, the electrode film is at least in contact with a surface of the semiconductor layer positioned within the inner circumference of the ring of the innermost guard ring portion and a surface of the filler in the withstanding voltage portions positioned within the inner circumference of the ring of the innermost guard ring portion, and a relay diffusion layer of the second conductivity type in a depth shallower than a bottom of the ring-shaped holes is provided at the surface within the semiconductor layer positioned between the guard ring portions, and the relay diffusion layer is not in contact with at least one of the two guard ring portions adjacent to each other.

According to the invention, in the above-described diode device, the relay diffusion layer in a width-wise direction of the ring of the guard ring portion is shorter than a distance between the guard ring portions adjacent to each other.

According to the invention, in the above-described diode device, the electrode film is provided in contact with an innermost guard ring portion among said guard ring portions.

According to the invention, in the above-described diode device, the electrode film is kept from contacting an innermost guard ring portion among said guard ring portions.

According to the invention, in the above-described diode device, the relay diffusion layer is provided in contact with one of the inner circumference and the outer circumference of the ring of the guard ring portion.

According to the invention, in the above-described diode device, the relay diffusion layer is kept from contacting the guard ring portions.

According to the invention, in the above-described diode device, the ring-shaped holes include other concentric holes other than those comprising the guard ring portions and positioned between an innermost guard ring portion among said guard ring portions and the withstanding voltage portions, the other concentric hole and a filler filling the other concentric hole form an intermediate ring portion, and insulating film is provided between the electrode film and the surface of the semiconductor layer positioned between the two intermediate ring portions adjacent to each other.

According to the invention, in the above-described diode device, the electrode film has its end extended at least to lie over the innermost guard ring portion.

The invention provides a transistor device including a semiconductor layer of a first conductivity type having a plurality of ring-shaped holes provided concentrically at one surface of the semiconductor layer and filled with a semiconductor filler of a second conductivity type, a base region of the second conductivity type provided in the vicinity of the one surface in the semiconductor layer and in an inner circumferential region of an innermost ring-shaped hole among the plurality of ring-shaped holes, a source region of the first conductivity type provided in the base region, a gate insulating film provided in contact with the base region and a gate electrode provided in contact with the gate insulating film. In this device, the plurality of ring-shaped holes and the semiconductor filler of the second conductivity type filling within the ring-shaped holes form a plurality of guard ring portions, each of the guard ring portions is kept from contacting the base region, and a relay diffusion layer of the second conductivity type in a depth shallower than a bottom of the ring-shaped hole is provided between the ring-shaped holes adjacent to each other and at the surface within the semiconductor layer, and kept from contacting at least one of the two ring-shaped holes adjacent to each other.

According to the invention, in the above-described transistor device, the relay diffusion layer is provided between the innermost ring-shaped hole and the base region and kept from contacting at least one of the innermost ring-shaped hole and the base region.

According to the invention, the transistor device further includes an ohmic layer of the same conductivity type as that of the semiconductor layer and having a higher concentration than that of the semiconductor layer provided at a surface of the semiconductor layer opposite to the surface provided with the base region, and a drain electrode film forming an ohmic junction with the ohmic layer at a surface of the ohmic layer.

According to the invention, the transistor device further includes a collector layer of a conductivity type different from that of the semiconductor layer provided at a surface of the semiconductor layer opposite to the surface provided with the base region, and a collector electrode film forming an ohmic junction with the collector layer at a surface of the collector layer.

According to the invention, the transistor device further includes a Schottky electrode film forming a Schottky junction with the semiconductor layer provided at a surface of the semiconductor layer opposite to the surface provided with the base region, and the Schottky junction is forward biased with a voltage of a polarity that reverse biases a PN junction formed between the semiconductor layer and the base region.

In the diode device and the transistor device according to the invention, when the first conductivity type is N-type, the second conductivity type is P-type, while conversely when the first conductivity type is P-type, the second conductivity type is N-type.

In the diode device according to the invention, a metal film forming an ohmic junction with the semiconductor layer is formed on a surface opposite to the surface provided with the holes. When a negative voltage for the electrode film is applied to the metal film, the Schottky junction between the electrode film and the semiconductor layer is forward biased, so that current is allowed to flow from the electrode film to the metal film through the Schottky junction.

At the time, the PN junction between the filler in the withstanding voltage portions and the semiconductor layer is also forward biased, but the barrier height of the PN junction is higher than that of the Schottky junction. Therefore, the current passed across the PN junction is far smaller than the current passed across the Schottky junction.

In the transistor device according to the invention, the semiconductor region serves as a drain region, a voltage of a polarity that reverse biases a PN junction formed between the base region and the drain region is applied between the source region and the drain region. Then, when a positive voltage equal to or higher than the threshold voltage is applied to the gate electrode film, an inversion layer of the first conductivity type is formed where the base region is in contact with the gate insulating film. The source region is connected to the drain region by the inversion layer, so that current is allowed to flow between the source region and the drain region.

When a drain layer of the same conductivity type as that of the semiconductor layer is provided on a surface opposite to the surface provided with the base region, and current is allowed to flow between the source region and the semiconductor layer (drain region), minority carriers are not injected into the semiconductor layer, so that the transistor device according to the invention is a MOSFET operating with majority carriers.

When a collector layer of a conductivity type different from that of the semiconductor layer is provided instead of the drain layer of the same conductivity type as that of the semiconductor layer, minority carriers are injected into the semiconductor layer and the device operates an IGBT.

In this case, the resistance across the area between the source region and the collector layer is lowered by conductivity modulation of the semiconductor layer.

A Schottky electrode film forming a Schottky junction with the semiconductor layer is provided on a surface opposite to the surface provided with the base resion, and a Schottky diode is formed between the semiconductor layer and the Schottky electrode film. When the Schottky diode is to be forward biased with a voltage of a polarity to reverse bias a PN junction diode formed between the semiconductor layer and the base region, minority carriers less than the case of the IGBT are injected into the semiconductor layer, so that both the resistance reduction based by the conductivity modification and high speed switching can be carried out.

When the PN junction formed between the semiconductor layer and the base region is reverse biased and the potential of the gate electrode is lower than the threshold voltage, current is not passed.

In this state, the PN junction between the base region and the semiconductor layer and the PN junctions between the guard ring portions and the semiconductor layer are reverse biased, and a depletion layer is expanded into the semiconductor layer from the base region and the guard ring portion.

In the case of the diode device, when a positive voltage for the electrode film is applied to the metal film, the Schottky junction between the electrode film and the semiconductor layer, the PN junctions between the semiconductor layer and the withstanding voltage portions, and the PN Junction between the semiconductor layer and the innermost guard ring portion are reverse biased, and a depletion layer is expanded from each of the PN junctions.

In the diode device and the transistor device according to the invention, a relay diffusion layer is provided in the semiconductor layer positioned between the guard ring portions adjacent to each other, and the width of the semiconductor layer between the adjacent guard ring portions is shorter where the relay diffusion layer is provided than where no such relay diffusion layer is provided. When a depletion layer is expanded from each of the guard ring portions, the part of the semiconductor layer with the shorter width is depleted earlier than the part with the longer width, and therefore the part provided with the relay diffusion layer is depleted with a voltage lower than a voltage that depletes the part without the relay diffusion layer.

Therefore, in the diode device and the transistor device according to the invention, the guard ring portions adjacent to each other can be connected by the depletion layer with a voltage lower than the voltage for the device without the relay diffusion layer.

When the size of the relay diffusion layer in the widthwise direction of the rings of the guard ring portions is increased, the width of the semiconductor layer is reduced by the increase. Therefore, all the guard ring portions may be connected by the depletion layers even with a low voltage as compared to the device having the relay diffusion layer whose size is shorter, so that the semiconductor layer positioned on the inner side of the outermost guard ring portion can be depleted.

In the conventional device without the relay diffusion layer, breakdown occurs because the semiconductor layer positioned within the inner circumference of the ring of the outermost guard ring portion is not entirely depleted. In the diode device and the transistor device according to the invention, the semiconductor layer is entirely depleted, and therefore unlike the conventional device, breakdown does not occur.

In the diode device and the transistor device according to the invention, the amount of the impurity of the first conductivity type in the semiconductor layer positioned on the inner side of the outermost guard ring portion and the amount of the impurity of the second conductivity type in the guard ring portions and the withstanding voltage portions are set to be equal. Then, when the semiconductor layer is completely depleted inside, the inside of the guard ring portions and the withstanding voltage portions positioned within the inner circumference of the ring of the outermost guard ring portion is completely depleted. Therefore, there is no area without a depletion layer within the inner circumference of the rind of the outermost guard ring portion. Therefore, electric field concentration that would otherwise occur in an area without a depletion layer does not occur, and breakdown does not occur.

Note that in the diode device and the transistor device according to the invention., the size of the relay diffusion layer in the width-wise direction of the ring of said guard ring portion is shorter than the distance between the guard ring portions adjacent to each other. As a result, the relay diffusion layer does not contact in at least one of two guard ring portions adjacent to each other, in other words, the adjacent guard ring portions are not connected by the relay diffusion layer.

BRIEF DESCRIPTION OF THE DRAWINGS

FIG. 15 is a plan view for use in illustration of a diode device according to another embodiment of the invention;

FIG. 16 is a sectional view taken along the line G—G in FIG. 15;

FIG. 17 is a plan view for use in illustration of a conventional diode device;

FIG. 18 is a sectional view taken along the line P—P in FIG. 17;

DETAILED DESCRIPTION OF THE PREFERRED EMBODIMENTS

Now, embodiments of the invention will be described in conjunction with the accompanying drawings.

Figure 4:
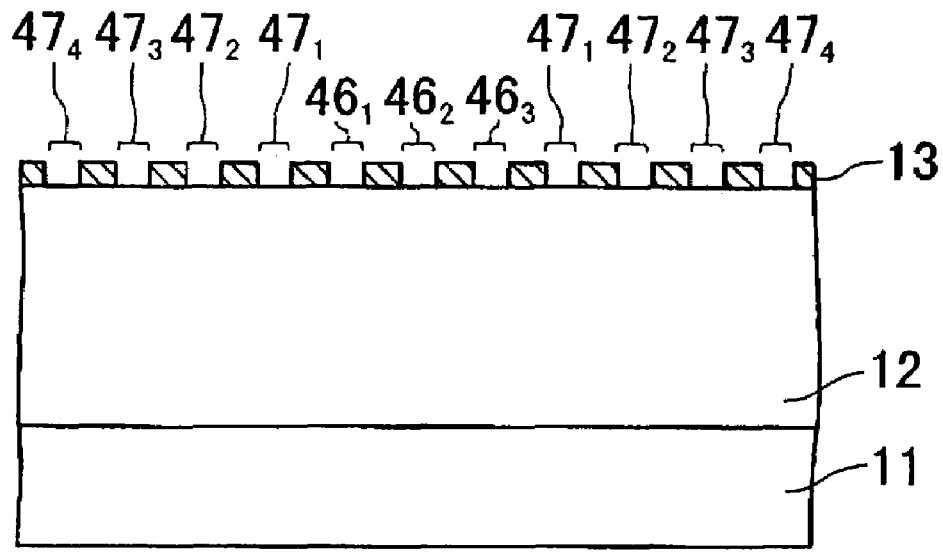
FIG. 4 is a first sectional view for use in illustration of the process of manufacturing the diode device according to the embodiment.

First, a method of manufacturing a diode device according to one embodiment of the invention will be described. Referring to FIG. 4, a semiconductor substrate 11 is made of N-type silicon. An N-type epitaxial layer 12, an example of a semiconductor layer according to the invention is formed on the surface of the semiconductor substrate 11. A patterned thermal oxide film 13 is deposited on the surface of the epitaxial layer 12. As shown in the plan view of FIG. 11, the thermal oxide film 13 has a plurality of openings $47_1$ to $47_4$ whose plane shape is a rectangular ring shape and a plurality of openings $46_1$ to $46_3$ whose plane shape is rectangular. The epitaxial layer 12 is exposed at the bottom of the rectangular ring-shaped openings $47_1$ to $47_4$ and at the bottom of the oblong openings $46_1$ to $46_3$. Herein, there are four rectangular ring-shaped openings $47_1$ to $47_4$ and three oblong openings $46_1$ to $46_3$. Note that FIG. 4 is a sectional view taken along the line C—C in FIG. 11.

Figure 11:
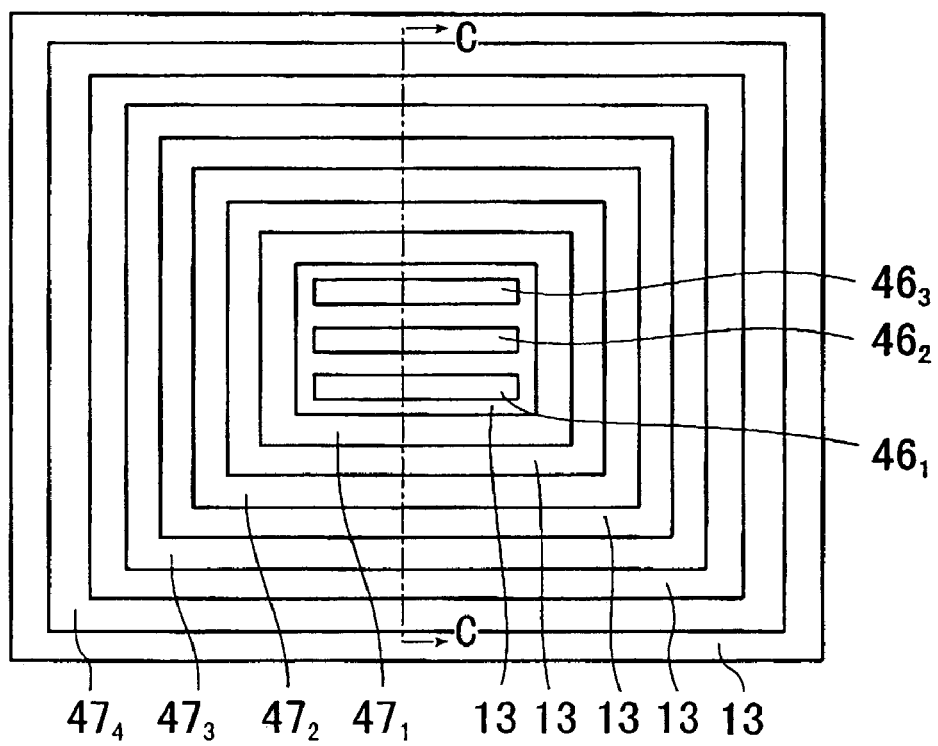
FIG. 11 is a first plan view for use in illustration of the process of manufacturing the diode device according to the embodiment.

As shown in FIG. 11, the rectangular ring-shaped openings $47_1$ to $47_4$ are provided concentrically at predetermined intervals, and the oblong openings $46_1$ to $46_3$ are provided parallel to each other within the inner circumference of the ring of the innermost rectangular ring-shaped opening $47_1$.

Figure 5:
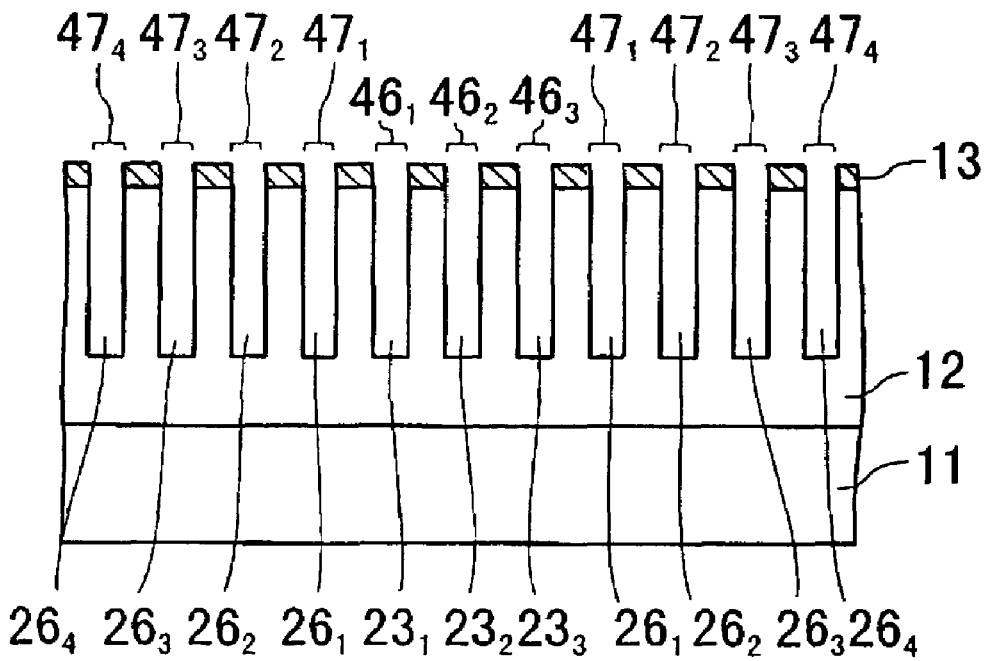
FIG. 5 is a second sectional view for use in illustration of the process of manufacturing the diode device according to the embodiment.

Using the thermal oxide film 13 as a mask, the epitaxial layer 12 exposed at the bottom of the rectangular ring-shaped openings $47_1$ to $47_4$ and at the bottom of the oblong openings $46_1$ to $46_3$ is etched, and the holes whose planer shape is the same as that of the openings of the thermal oxide film 13 are formed. As shown in FIG. 5, narrow rectangular holes $23_1$ to $23_3$ are formed in the same positions as the oblong openings $46_1$ to $46_3$. Rectangular ring-shaped holes $26_1$ to $26_4$ are formed in the same positions as the rectangular ring-shaped openings $47_1$ to $47_4$.

These narrow rectangular holes $23_1$ to $23_3$ and the rectangular ring-shaped holes $26_1$ to $26_4$ are examples of holes to be filled according to the invention and formed simultaneously in the same etching process. Therefore, these holes have the same depth, and the bottoms of the narrow rectangular holes $23_1$ to $23_3$ and the rectangular ring-shaped holes $26_1$ to $26_4$ are positioned inside the epitaxial layer 12.

Then, while a gas containing a P-type impurity, boron is made to flow, an epitaxial layer is grown in the narrow rectangular holes $23_1$ to $23_3$ and the rectangular ring-shaped holes $26_1$ to $26_4$, and thus the holes are filled with the filler made of the P-type epitaxial layer. At the time, the filler fills up to the level of the surface of the epitaxial layer 12, and since the openings $46_1$ to $46_3$ and $47_1$ to $47_4$ in the thermal oxide film 13 are positioned in a higher than the surface of the filler, the openings $46_1$ to $46_3$ and $47_1$ to $47_4$ are left unfilled. The filler is therefore exposed at the bottom of the openings $46_1$ to $46_3$ and $47_1$ to $47_4$.

Figure 6:
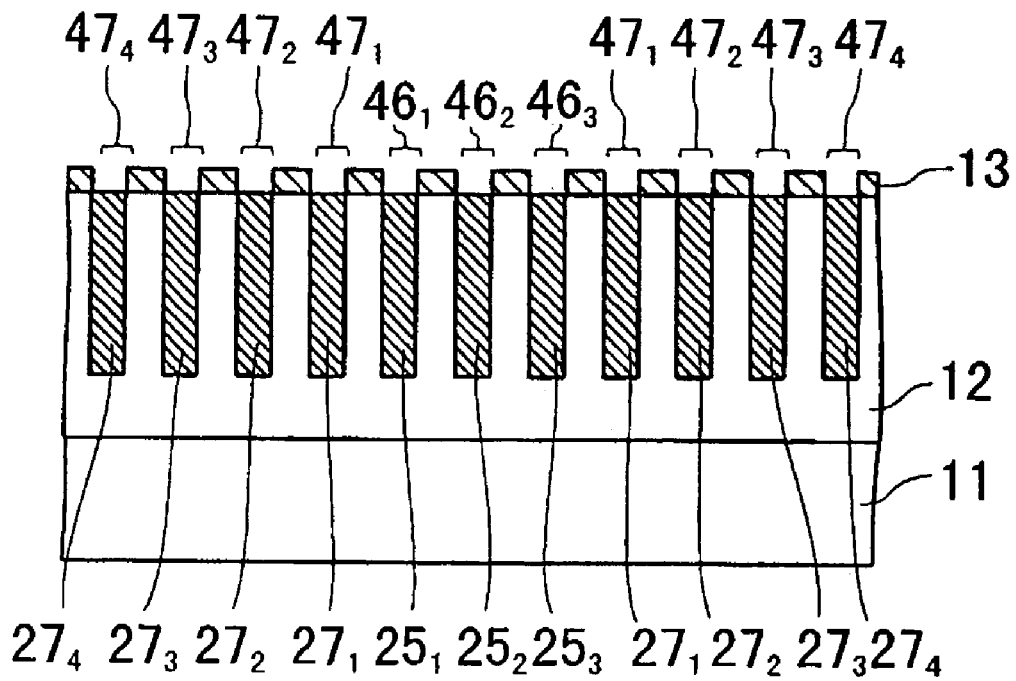
FIG. 6 is a third sectional view for use in illustration of the process of manufacturing the diode device according to the embodiment.

As shown in FIG. 6, the filler portions in the rectangular ring-shaped holes $26_1$ to $26_4$ are referred to as guard ring portions $27_1$ to $27_4$, while filler positioned in the narrow holes $23_1$ to $23_3$ are referred to as withstanding voltage portions $25_1$ to $25_3$. In this way, the guard ring portions $27_1$ to $27_4$ are provided concentrically at predetermined intervals, and the withstanding voltage portions $25_1$ to $25_3$ are positioned within the inner circumference of the ring of the innermost guard ring portion $27_1$.

During the epitaxial growth described above, the flow rate and impurity concentration of the gas are controlled so that the impurity concentration in the withstanding voltage portions $25_1$ to $25_3$ and the guard ring portions $27_1$ to $27_4$ is uniform.

Figure 7:
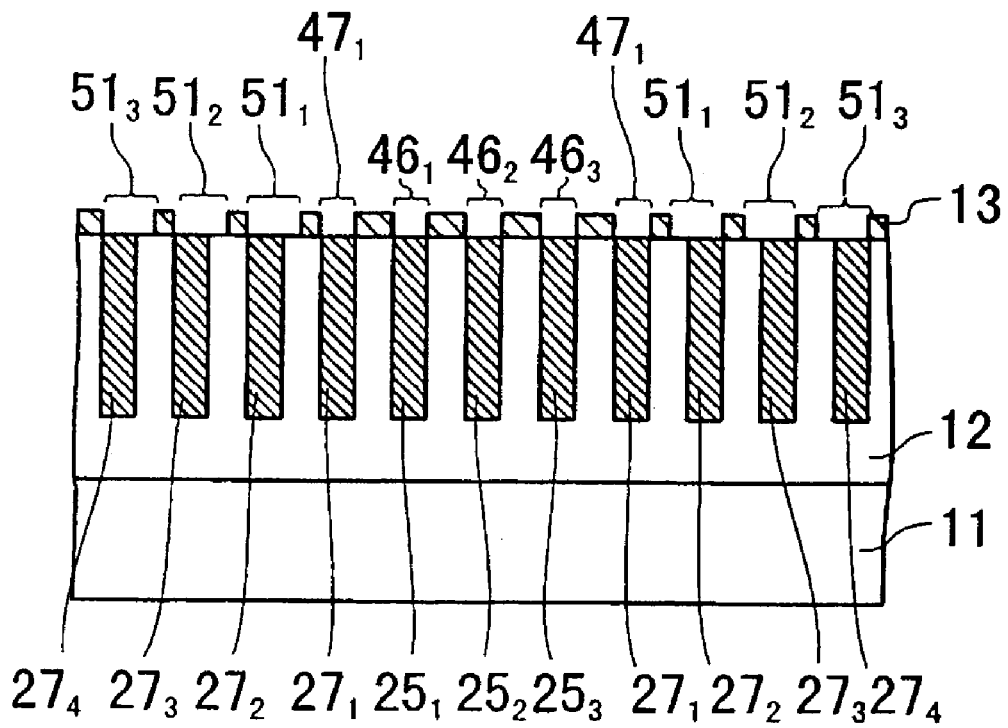
FIG. 7 is a fourth sectional view for use in illustration of the process of manufacturing the diode device according to the embodiment.
Figure 12:
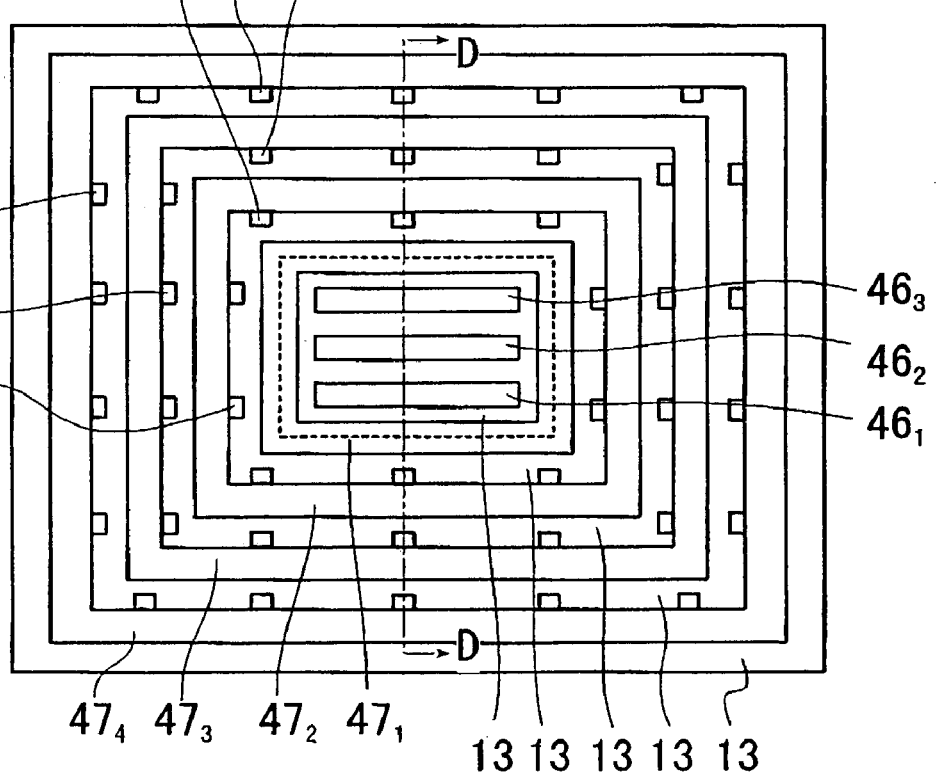
FIG. 12 is a second plan view for use in illustration of the process of manufacturing the diode device according to the embodiment.

Then, in the thermal oxide film 13, the side walls forming the rectangular ring-shaped openings $47_2$ to $47_4$ (excluding the innermost rectangular ring-shaped openings $47_1$) at the inner circumferential side are partly etched away to form new openings. The new openings denoted by $51_1$ to $51_3$ as shown in FIGS. 7 and 12 extend inward from the inner circumference of the rings of the rectangular ring-shaped openings $47_2$ to $47_4$, respectively. These new openings $51_1$ to $51_3$ have a rectangular shape in plane view. The epitaxial layer 12 is exposed at their bottoms. Note that FIG. 7 is a sectional view taken along the line D—D in FIG. 12.

Then, when P-type impurity ions, boron ions are irradiated on the surface of the epitaxial layer 12 using the thermal oxide film 13 as a mask, the P-type impurity is doped into the guard ring portions $27_1$ to $27_4$ exposed at the bottom of the rectangular ring-shaped openings $47_1$ to $47_4$ and the surface of the epitaxial layer 12 exposed at the bottom of the new openings $51_1$ to $51_3$.

Figure 8:
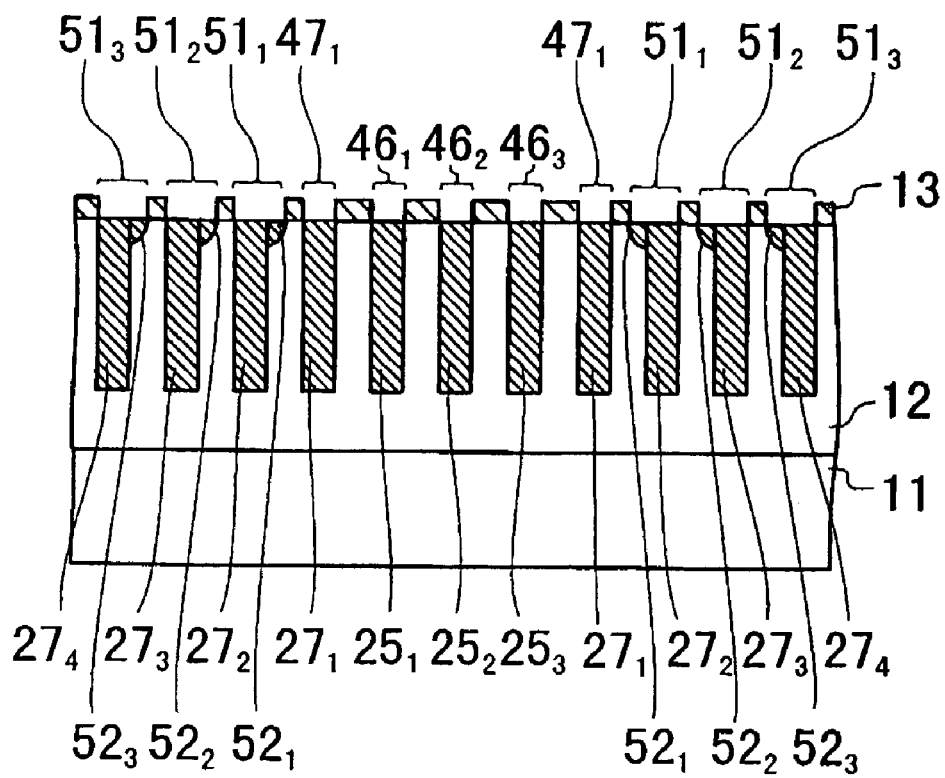
FIG. 8 is a fifth sectional view for use in illustration of the process of manufacturing the diode device according to the embodiment.

Subsequent heat treatment allows the implanted P-type impurity to diffuse both into the guard ring portions $27_2$ to $27_4$ and the epitaxial layer 12. The guard ring portions $27_1$ to $27_4$ are a P-type semiconductor layer, and therefore the diffused P-type impurity raises the impurity concentration in the vicinity of the surface of the guard ring portions $27_1$ to $27_4$, but the conductivity is unchanged and still P-type. In contrast, the P-type impurity diffused into the epitaxial layer 12 exposed at the bottom of the newly formed openings $51_1$ to $51_3$ causes the conductivity type of the epitaxial layer 12 to be inverted from N-type to P-type, and a P-type impurity diffusion layer is formed at the surface of the epitaxial layer 12 exposed at the bottom of the new openings $51_1$ to $51_3$ (FIG. 8).

These new P-type impurity diffusion layers; hereinafter referred to as relay diffusion layers $52_1$ to $52_3$, project inward from the inner circumference of the rings of the guard ring portions $27_2$ to $27_4$ (excluding the innermost guard ring portion $27_1$), and the relay diffusion layers $52_1$ to $52_3$ are in contact with the guard ring portions $27_2$ to $27_4$, respectively. The relay diffusion layers $52_1$ to $52_3$ have a very shallow depth about in the range from 0.8 μm to 1 μm. In this state, the thermal oxide film 13 is positioned on the surface of the N-type epitaxial layer 12.

Figure 9:
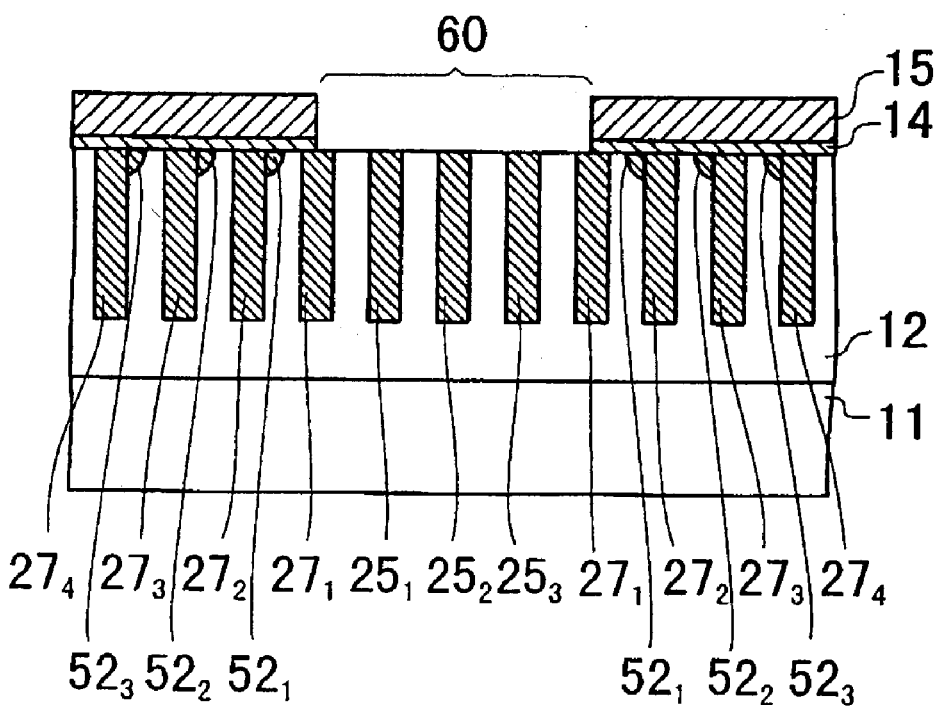
FIG. 9 is a sixth sectional view for use in illustration of the process of manufacturing the diode device according to the embodiment.

The thermal oxide film 13 positioned on the surface of the epitaxial layer 12 is entirely removed, then a new thermal oxide film is deposited by thermal oxidation on the surface of the epitaxial layer 12 including the inner surface of openings, and a PSG film is deposited on the surface of the thermal oxide film by CVD method or the like, so that a protection film made of the thermal oxide film and the PSG film is formed. Then, the lamination film is patterned to form an opening having its edge positioned on the central line of the innermost guard ring $27_1$ that bisects the innermost guard ring $27_1$ in the width-wise direction (referred to as "innermost ring central line"). Then, the surface of the withstanding voltage portions $25_1$ to $25_3$, the surface of the epitaxial layer 12 positioned within the innermost ring central line, and part of the surface of the innermost guard ring portion $27_1$ positioned within the innermost ring central line thereof are exposed at the bottom of the opening. FIG. 9 is the cross section showing the thermal oxide film 14, the PSG film 15, and the opening 60.

Figure 10:
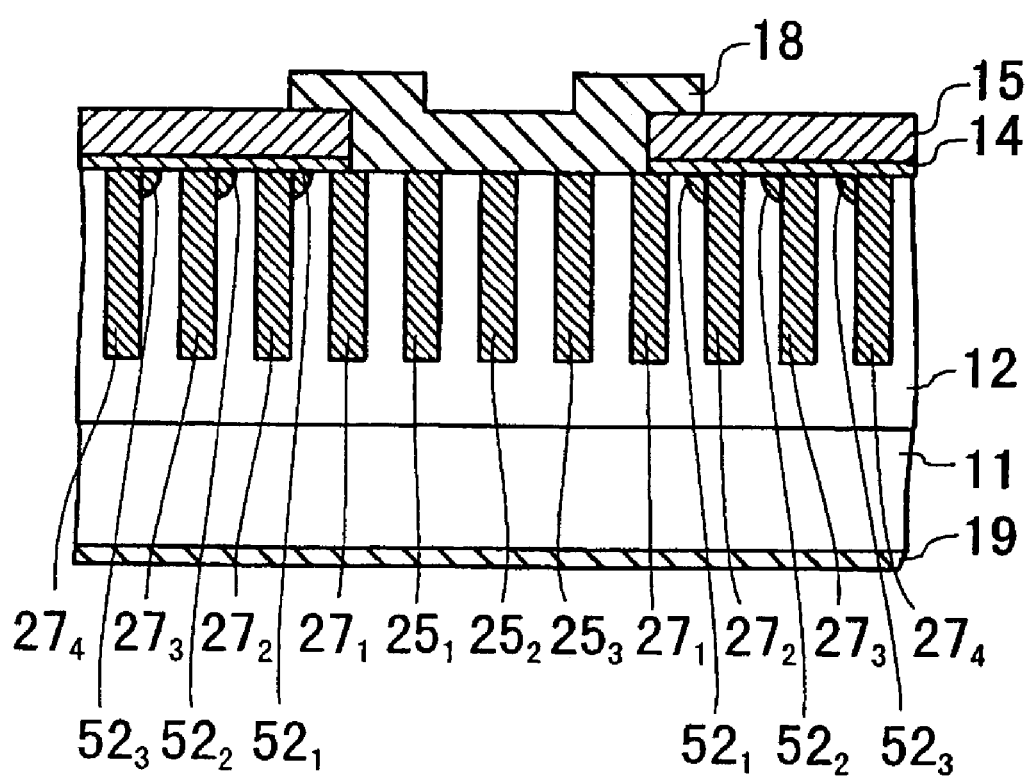
FIG. 10 is a seventh sectional view for use in illustration of the process of manufacturing the diode device according to the embodiment.

Then, a metal film is formed by sputtering a metal on the surface of the PSG film 15, and the surfaces of the epitaxial layer 12, the withstanding voltage portions $25_1$ to $25_3$ and the innermost guard ring portion $27_1$ exposed at the bottom of the opening 60. Then, the metal film is patterned to form an anode electrode film. The anode electrode film is denoted by reference numeral 18 in FIG. 10. The metal for the metal film is of a kind that forms a Schottky junction with the epitaxial layer 12 and an ohmic junction with the withstanding voltage portions $25_1$ to $25_3$. Herein, the metal is chromium. The bottom of the anode electrode film 18 is in contact with the surface of the epitaxial layer 12, the surface of the withstanding voltage portions $25_1$ to $25_3$ and the innermost guard ring portion $27_1$ exposed at the bottom of the opening 60, while the anode electrode film 18 is kept from contacting the other guard ring portions $27_2$ to $27_4$. The Schottky junction formed by the anode electrode film 18 and the epitaxial layer 12, and the ohmic junction formed by the anode electrode film 18 and the withstanding voltage portions $25_1$ to $25_3$, and the ohmic junction formed by the anode electrode film 18 and innermost guard ring portion $27_1$ are positioned within the inner circumference of the ring of the innermost guard ring portion $27_1$.

Figure 1:
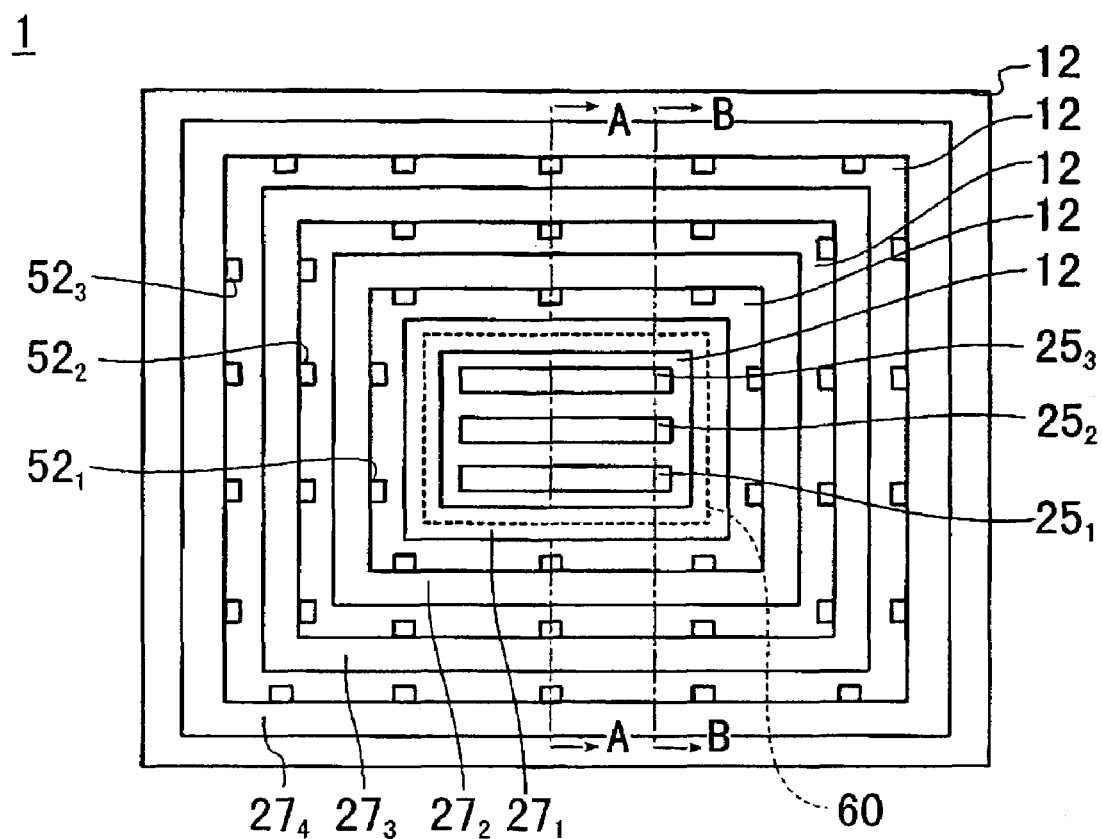
FIG. 1 is a plan view for use in illustration of a diode device according to one embodiment of the present invention.
Figure 2:
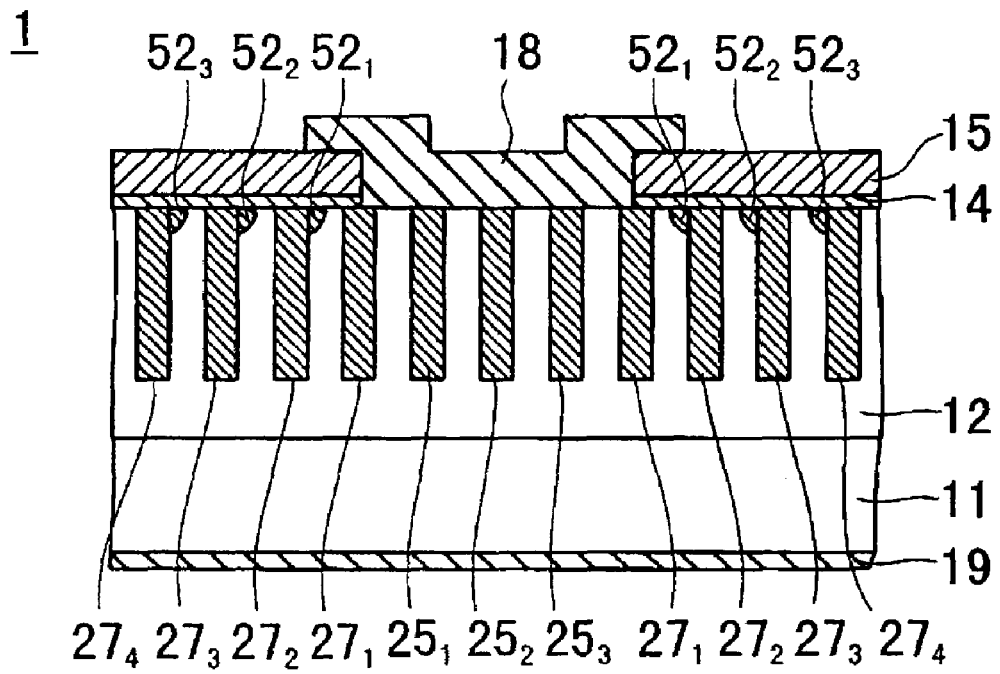
FIG. 2 is a sectional view taken along the line A—A in FIG. 1.
Figure 3:
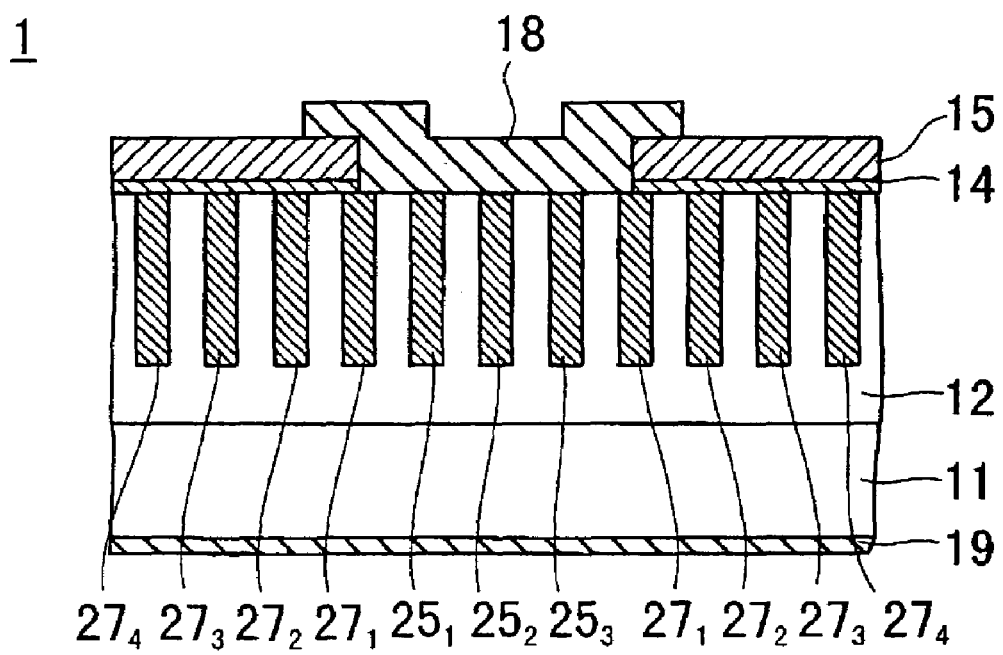
FIG. 3 is a sectional view taken along the line B—B in FIG. 1.

Then, a cathode electrode film 19 made of a thin metal film that forms an ohmic junction with the semiconductor substrate 11 is formed at one surface of the semiconductor substrate 11 opposite to the side of the epitaxial layer 12. After the above process, the diode device 1 according to the embodiment shown in FIGS. 1 to 3 is complete. FIG. 1 is a plan view of the diode device 1, and FIGS. 2 and 3 are sectional views taken along the lines A—A and B—B, respectively in FIG. 1. For the ease of illustration, the anode electrode film 18, the thermal oxide film 14 and the PSG film 15 are not shown in FIG. 1, while reference numeral 60 indicates the opening in the thermal oxide film 14 and the PSG film 15.

The n-th guard ring portion is denoted by $27_n$, the guard ring portion positioned next to it on the outer side is denoted by $27_{n+1}$, and the relay diffusion layer provided between them is denoted by $52_n$. The width of the epitaxial layer 12 positioned between the guard ring portions $27_n$ and $27_{n+1}$ is set to a fixed value a, and the width is shorter where the relay diffusion layer $52_n$ is provided than the width a of the other part. Herein, since the width of the relay diffusion layer $52_n$ is a/2, the width of the remaining epitaxial layer 12 is a/2.

When a negative voltage for the anode electrode film 18 is applied to the cathode electrode film 19, the Schottky junction between the anode electrode film 18 and the epitaxial layer 12 is forward biased, so that current is passed from the anode electrode film 18 to the cathode electrode film 19.

At the time, the PN junctions between the withstanding voltage portions $25_1$ to $25_3$ and the epitaxial layer 12 and the PN junction between the innermost guard ring portion $27_1$ and the epitaxial layer 12 are forward biased. However, the barrier height of the PN junction is higher than the barrier height of the Schottky junction, and therefore the current passed across the PN junction is far smaller than the current passed across the Schottky junction.

Conversely, when a positive voltage for the anode electrode film 18 is applied to the cathode electrode film 19, the Schottky junction between the anode electrode film 18 and the epitaxial layer 12 and the PN junctions between the withstanding voltage portions $25_1$ to $25_3$ and the innermost guard ring portion $27_1$ and the epitaxial layer 12 are reverse biased. Then, a depletion layer is expanded each from the Schottky junction and the PN junctions.

Among these depletion layers, the depletion layer from the Schottky junction is expanded into the inside of the epitaxial layer 12. The depletion layers from the PN junctions are expanded into the N-type epitaxial layer 12, the P-type withstanding voltage portions $25_1$ and $25_3$, and the P-type innermost guard ring portion $27_1$. Among the depletion layers expanded into the N-type epitaxial layer 12, let us now consider the depletion layers expanded from the PN junction at the innermost guard ring portion $27_1$, particularly the depletion layer expanded from the PN junction on the outer circumference of the ring of the innermost guard ring portion $27_1$.

The depletion layer is expanded from the PN junction on the outer circumference of the ring of the innermost guard ring portion $27_1$. Then, as described above, between innermost guard ring portion $27_1$ and the second guard ring portion $27_2$, the width of the epitaxial layer 12 where there is the relay diffusion layer $52_1$ is half that of the part without the relay diffusion layer $52_1$, i.e., the width is a/2. When the depletion layer is expanded from the innermost guard ring portion $27_1$ for a/2, the depletion layer reaches the relay diffusion layer $52_1$, and connects the innermost guard ring portion $27_1$ and the second guard ring portion $27_2$ through the relay diffusion layer $52_1$. Then, the depletion layer is expanded from the second guard ring portion $27_2$ both in the inward and outward directions for the same distance a/2 as the depletion layer from the innermost guard ring portion $27_1$ does.

The depletion layer expanded intward inward from the second guard ring portion $27_2$ expands toward the innermost guard ring portion $27_1$, while the depletion layer expanded outward from the innermost guard ring portion $27_1$ is expanded toward the second guard ring portion $27_2$.

These depletion layers each expand for a/2, while the distance between the adjacent guard ring portions is a, and therefore an end of one depletion layer reaches an end of the other depletion layer. Consequently, the epitaxial layer 12 between the innermost and second guard ring portions $27_1$ and $27_2$ is depleted.

Meanwhile, the depletion layer expanded outward from the second guard ring portion $27_2$ is also expanded toward the third guard ring portion $27_3$ for a/2. Therefore, the end of the depletion layer reaches the relay diffusion layer $52_2$, and the third guard ring portion $27_3$ and the second guard ring portion $27_2$ are connected by the depletion layer.

As a result, the depletion layer is expanded from the third guard ring portion $27_3$ for a/2 both in the inward and outward directions. Similarly to the above, the depletion layer expanded inward from the third guard ring portion $27_3$ and the depletion layer expanded outward from the second guard ring portion $27_2$ arranged on the inner side of the third guard ring portion $27_3$ cause the epitaxial layer between these guard ring portion $27_2$ and $27_3$ to be depleted. The depletion layer expanded outward from the third guard ring portion $27_3$ causes the fourth guard ring portion $27_4$ at the outer periphery of the third guard ring portion $27_3$ and the innermost to the third guard ring portions $27_1$ to $27_3$ positioned more on the inner side of the guard ring portion $27_4$ to be connected with each other.

According to the invention, the distance between the guard ring portions is equal among each other. When a depletion layer is expanded from a first inner guard ring portion for half the distance of the interval between the guard ring portions, the inner guard ring portion and the adjacent outer guard ring portion are connected each other by depletion layer. Therefore, when the adjacent two guard ring portions are connected each other by the depletion layer, the spaces between the guard ring portions positioned at the inner side of the two adjacent guard ring portions are connected by the depletion layer. Then, the depletion layer expanded outward from these guard ring portions reaches, and the next guard ring portion on the outer side are also connected.

When the area between the innermost and second guard ring portions is depleted, the depletion is transmitted to the outermost guard ring-portion, and the epitaxial layer between the guard ring portions positioned on the inner side of the outermost guard ring portion are all depleted.

At the time, according to the invention, the epitaxial layer on the inner side of the innermost guard ring portion is entirely depleted. An arbitrary guard ring portion is selected and the total amount of the P-type impurity and the total amount of the N-type impurity within the central line of the guard ring portion are set equal, so that the P-type region positioned on the inner side of the outermost guard ring portion is entirely depleted.

The conventional diode device is not provided with the relay diffusion layers, and therefore breakdown occurs before the depletion layer reaches the outermost guard ring portion. In the diode device 1 according to the invention, the N-type epitaxial layer 12 positioned on the inner side of the central line of the ring of the outermost guard ring portion $27_4$ is entirely depleted, and therefore the P-type guard ring portions $27_1$ to $27_4$ and the withstanding voltage portions $25_1$ to $25_3$ are entirely depleted inside.

Consequently, there is no area without a depletion layer on the inner side of the outermost guard ring portion $27_4$, and therefore electric field concentration that would otherwise occur in an area without a depletion layer does not occur. Thus, the breakdown do not caused by the electric field concentration and the withstanding voltage improves.

Note that in the diode device 1 of this embodiment, the interval between the guard ring portions $27_n$ to $27_{n+1}$ is all a, and the size of the epitaxial layer 12 where provided with the relay diffusion layer is all a/2, but the invention is not limited to these. The effect of the invention is provided as long as the relay diffusion layers are provided to cause the epitaxial layer 12 positioned on the inner side of the outermost guard ring portion $27_4$ to be entirely depleted. In the described embodiment, the diode device 1 has four guard ring portions $27_1$ to $27_4$, but the number of the guard ring portions according to invention may be any number other than four.

Figure 13:
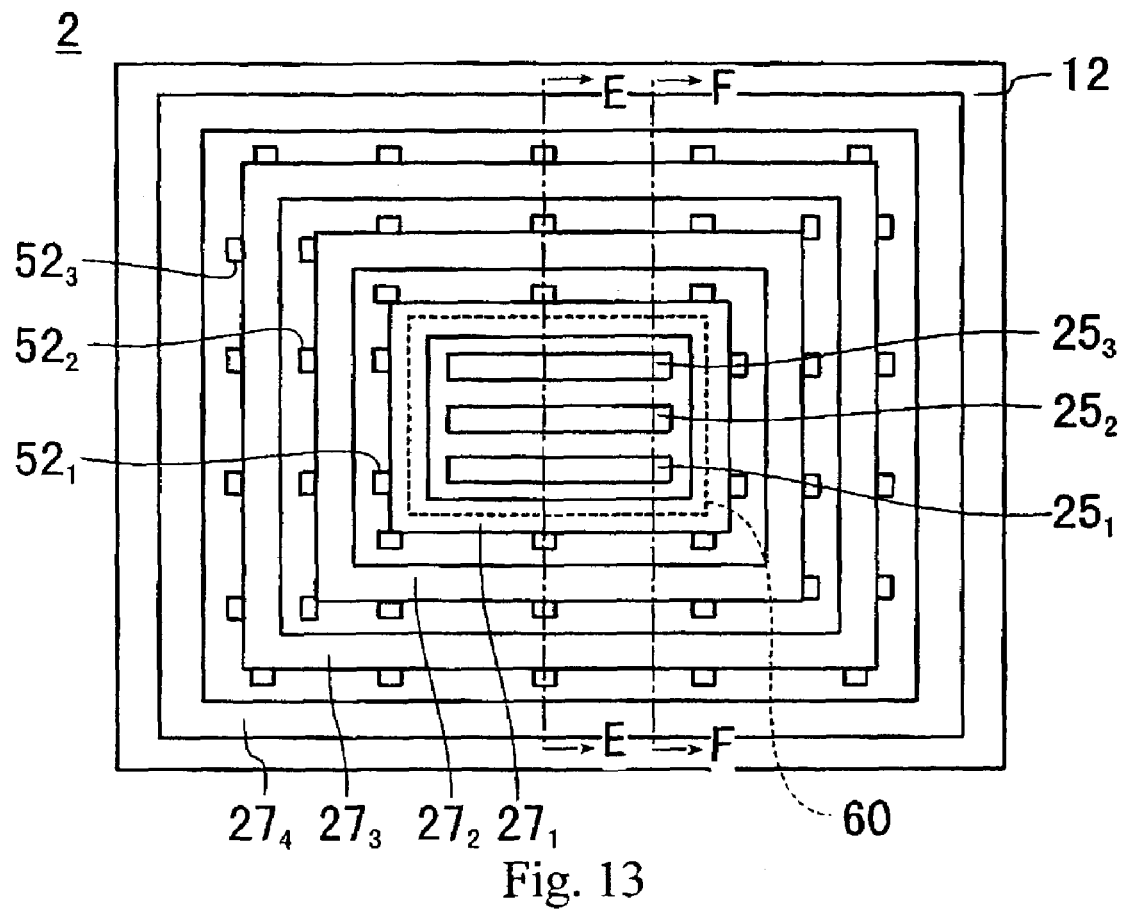
FIG. 13 is a plan view for use in illustration of a diode device according to another embodiment of the invention.
Figure 14:
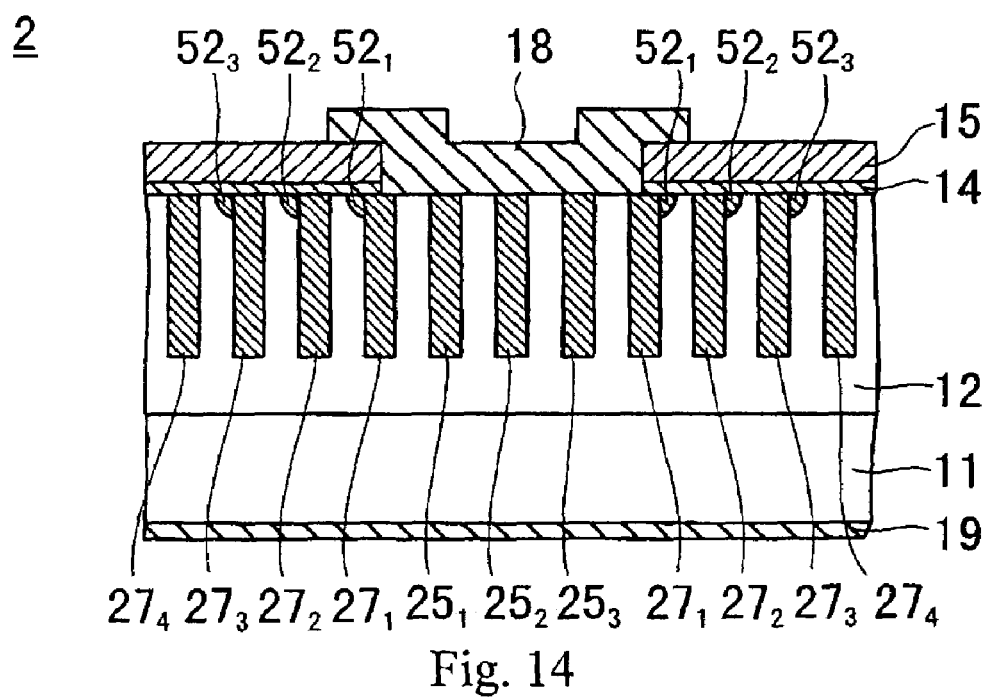
FIG. 14 is a sectional view taken along the line E—E in FIG. 13.

In the above description, the diode device 1 has the relay diffusion layers $52_1$ to $52_3$ that are provided to project inward from the inner circumference of the rings of the guard ring portions $27_2$ to $27_4$ excluding the innermost guard ring portion $27_1$, but the diode device 1 according to the invention is not limited to this arrangement. For example, like a diode device 2 as shown in FIGS. 13 and 14, the relay diffusion layers $52_1$ to $52_3$ may be provided to project outward from the outer circumference of the rings of the guard ring portions $27_1$ to $27_3$ excluding the outermost guard ring portion $27_4$.

In this arrangement, the relay diffusion layer $52_n$ is provided between the adjacent guard ring portions $27_n$ and $27_{n+1}$, and therefore similarly to the diode device 1 as shown in FIGS. 1 to 3, the epitaxial layer 12 positioned within the inner circumference of the ring of the outermost guard ring portion $27_4$ can be entirely depleted.

Like a diode device 3 as shown in FIGS. 15 and 16, the relay diffusion layers $52_1$ to $52_3$ may be kept from contacting any of the guard ring portions $27_n$ and $27_{n+1}$ adjacent to each other. In this arrangement, the relay diffusion layer $52_n$ is provided between the adjacent guard ring portions $27_n$ and $27_{n+1}$, and therefore similarly to the diode device 1 as shown in FIGS. 1 to 3, the epitaxial layer 12 positioned within the inner circumference of the ring of the outermost guard ring portion $27_4$ can be entirely depleted with a low voltage.

The relay diffusion layers $52_1$ to $52_3$ are provided partly at the inner circumference of the rings of the guard ring portions $27_2$ to $27_4$, the invention is not limited to the arrangement and the relay diffusion layers $52_1$ to $52_3$ may be provided at the entire inner or outer circumference of the rings of the guard ring portions $27_2$ to $27_4$.

The size of the relay diffusion layers $52_1$ to $52_3$ in the width-wise direction of the rings of the guard ring portions $27_1$ to $27_4$ is about half the interval between the adjacent guard ring portions $27_n$ and $27_{n+1}$, but the invention is not limited to the arrangement. When the size of the relay diffusion layers in the width-wise direction of the rings of the guard ring portions $27_1$ to $27_4$ is increased, the width of the epitaxial layer is reduced by the increase. Therefore, when the size of the relay diffusion layers $52_1$ to $52_3$ is large in the device, all the guard ring portions $27_1$ to $27_4$ may be connected by the depletion layers with a low voltage as compared to a device having a relay diffusion layer having a shorter size.

When there is no relay diffusion layer 52 between the guard ring portions 27, the minimum voltage to connect between the adjacent guard ring portions $27_1$ and $27_{n+1}$ by a depletion layer is referred to as "depletion voltage." As described above, according to the invention, when a voltage lower than the depletion voltage is applied, all the guard ring portions $27_1$ to $27_4$ can be connected by the depletion layers. In particular, the size of the relay diffusion layers in the width-wise direction of the ring may be adjusted so that the voltage to which the guard ring portions $27_1$ to $27_4$ are connected may be changed.

The anode electrode film 18 is in contact with the innermost guard ring portion $27_1$ and at the same potential as that of the anode electrode film 18, but the invention is not limited to this, and the anode electrode film 18 for example may be kept from contacting the innermost guard ring portion $27_1$.

Figure 19:
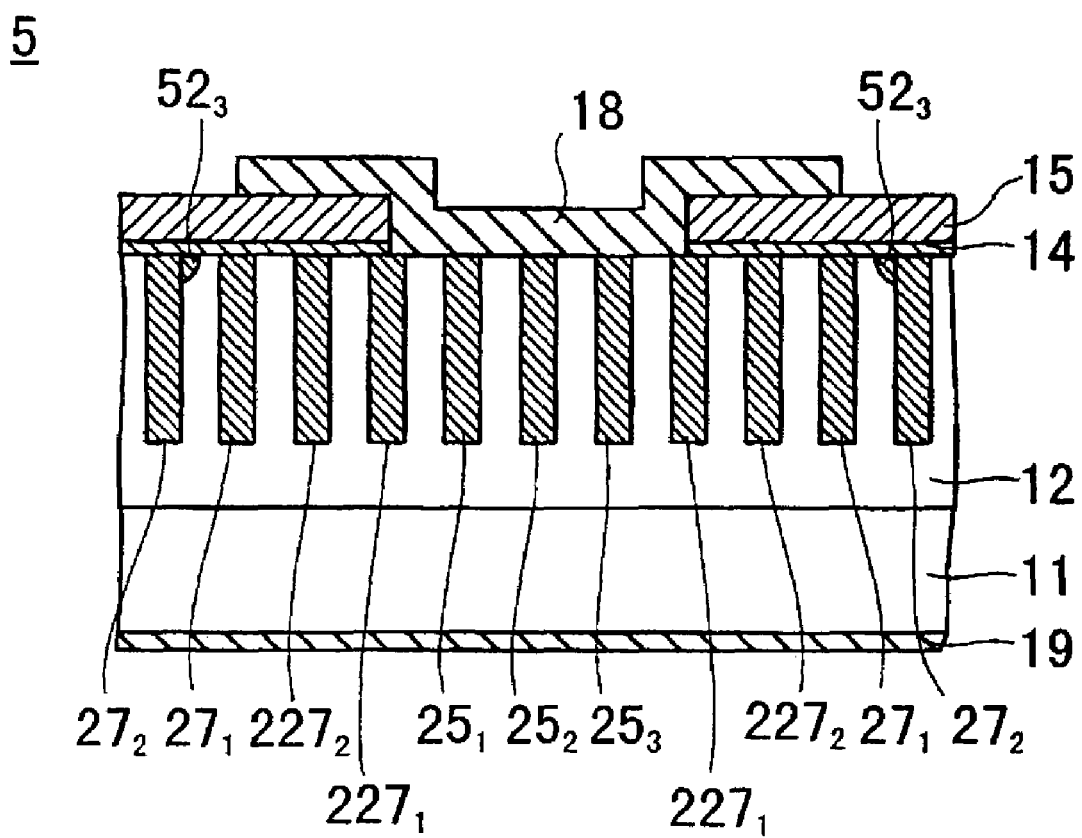
FIG. 19 is a sectional view of a diode device according to an embodiment of the invention, in which an anode electrode film positioned on an epitaxial layer has a large area.

With reference to another example of the invention, as denoted by reference numeral 5 in FIG. 19, intermediate ring portions $227_1$ and $227_2$ may be concentrically provided in the inner side of the innermost guard ring portion $27_1$ and surrounding the withstanding voltage portions $25_1$ to $25_3$ in the diode device 1 described above. The intermediate ring portions $227_1$ and $227_2$ are ring-shaped holes filled with a filler made of a P-type epitaxial layer, having the same depth as those of the guard ring portions $27_1$ to $27_4$, and provided concentrically at predetermined intervals with respect to the guard ring portions $27_1$ to $27_4$. Unlike the areas between the guard ring portions $27_1$ to $27_4$, the epitaxial layer 12 between the intermediate ring portions $227_1$ and $227_2$ is not provided with a relay diffusion layer.

A diode device 5 has a two-layer insulating film including a thermal oxide film 14 and a PSG film 15 formed thereon. The anode electrode film 18 is connected to at least the epitaxial layer 12 and the withstanding voltage portions $25_1$ to $25_3$ through an opening provided in the two-layer insulating film.

Herein, the innermost guard ring portion $27_1$ is insulated from the anode electrode film 18 by the two insulating films, and part of the surface of the intermediate ring portion $227_1$ positioned at the innermost circumference, and the surface of the region on the outer side of the intermediate ring portion $227_1$ is covered with the two-layer insulating film.

The anode electrode film 18 is extended to the outer side of the outermost intermediate ring portion $227_2$, and the end is disposed at least on the outer side of the upper part of the innermost guard ring portion $27_1$.

Therefore, the anode electrode film 18 is positioned on and above the intermediate ring portions $227_1$ and $227_2$, and above the epitaxial layer 12 between the intermediate ring portions $227_1$ and $227_2$, and between the intermediate ring portion $227_2$ and the guard ring portion $27_1$.

The part of the anode electrode film 18 positioned above the epitaxial layer 12 through the two-layer insulating film forms a MOS structure. When a voltage of a polarity to reverse bias the Schottky junction is applied to the anode electrode film 18, the carrier density at the surface of the epitaxial layer 12 where the MOS structure is formed is reduced. Meanwhile, when the reverse biasing voltage is large, carriers of the opposite type conductivity are induced at the surface of the epitaxial layer 12 forming the MOS structure, so that an inversion layer forms.

In this case, when the reverse biasing voltage applied to the anode electrode film 18 is not more than the depletion voltage described above, the part of the epitaxial layer 12 forming the MOS structure is depleted at least in the vicinity of the surface.

The intermediate ring portion $227_2$ and the guard ring portions $27_1$ to $27_4$ are kept from contacting the anode electrode film 18, and held at a floating potential. But when the part of the epitaxial layer 12 forming the MOS structure is depleted in the vicinity of the surface, the intermediate ring portions $227_1$ and $227_2$ are connected with each other by the depletion layer or the outermost intermediate ring portion $227_2$ and the innermost guard ring portion $27_1$ are connected by the depletion layer and the potential is stabilized.

Note that in the above examples, the first conductivity type is N-type and the second conductivity type is P-type, but conversely, the first conductivity type may be P-type, and the second conductivity type may be N-type.

In the above described embodiment, the depth of the relay diffusion layers $52_1$ to $52_3$ from the surface of the epitaxial layer 12 is as shallow as 0.8 μm to 1 μm, but the depth of relay diffusion layers $52_1$ to $52_3$ is not limited to the range and may be in any range as long as the bottom of the relay diffusion layers $52_1$ to $52_3$ is positioned in a higher level than the bottom of the guard ring portions $27_1$ to $27_4$.

Although the above description concerns the diode device according to the invention, the invention also applies to transistor devices.

Figure 20:
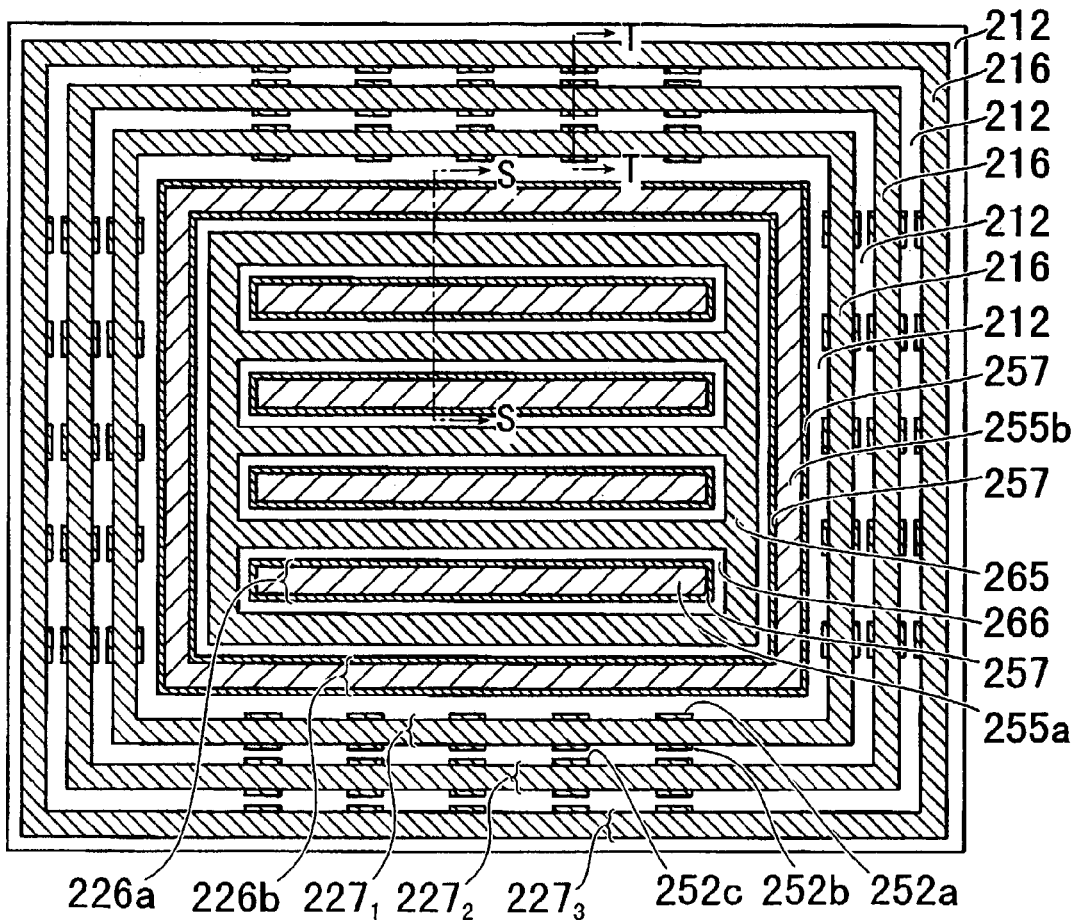
FIG. 20 is a plan view for use in illustration of the diffusion structure of a transistor device according to an example of the invention.
Figure 21:
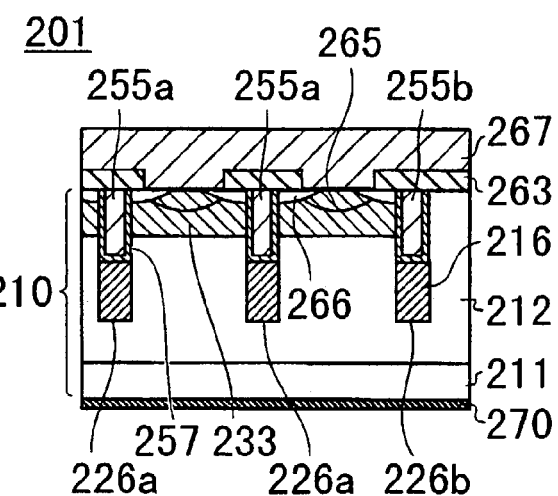
FIG. 21 is a sectional view taken along the line S—S in FIG. 20.
Figure 22:
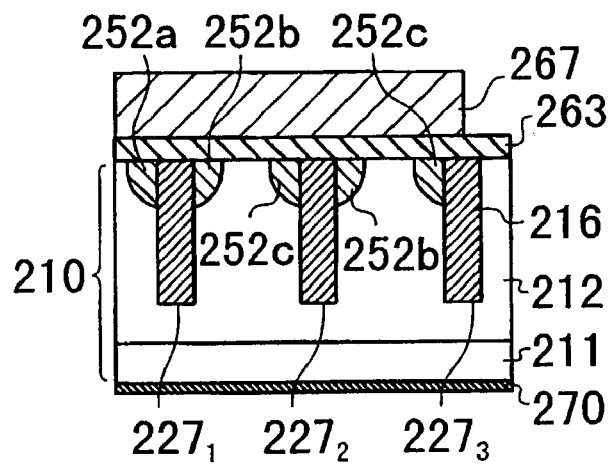
FIG. 22 is a sectional view taken along the line T—T in FIG. 20.

FIG. 20 is a plan view for use in illustration of the diffusion structure of a transistor device 201 according to one example of the invention. FIG. 21 is a sectional view taken along the line S—S in FIG. 20, and FIG. 22 is a sectional view taken along the line T—T in FIG. 20.

Similarly to the diode device 1 described above, the transistor device 201 comprises a semiconductor layer 212 of a first conductivity type made of epitaxially grown monocrystalline silicon, on one surface of which there are a plurality of ring-shaped grooves $227_1$ to $227_3$ provided concentrically at predetermined intervals and filled with a semiconductor filler 216 of a second conductivity type up to the height of the surface. The plurality of ring-shaped grooves $227_1$ to $227_3$ and the semiconductor filler 216 filling them form a plurality of guard ring portions. The guard ring portions are not electrically connected with each other, and not connected to a source electrode film or a gate electrode (that will be described) either, in other words, they are held at a floating potential.

On the inner side of the innermost groove $227_1$ among the ring-shaped grooves $227_1$ to $227_3$, there is a ring-shaped groove 226b having only its bottom filled with a semiconductor filler 216. In the region on the inner side of the groove 226b, there are a plurality of linear active grooves 226a arranged parallel to each other and having their bottoms filled with the semiconductor filler 216. FIG. 20 shows four such active grooves 226a.

The semiconductor filler 216 in the ring-shaped grooves $227_1$ to $227_3$ and the semiconductor filler 216 at the bottom of the linear and ring-shaped grooves 226a and 226b are in contact with the semiconductor layer 212 and form PN junctions.

The grooves $227_1$ to $227_3$, 226a, and 226b are formed together in the same manufacturing process, and have the same depth.

At the upper part of the semiconductor layer 212 positioned above the grooves 226a and 226b having their bottoms filled with the semiconductor filler 216, a base region 233 of the second conductivity type is formed by a diffusion process.

The diffusion depth of the base region 233 is not large enough to reach the upper end of the semiconductor filler 216, and at the upper part of the side surface in a level higher than the semiconductor filler 216 inside the grooves 226a and 226b, the base region 233 is exposed. Below the level, the semiconductor layer 212 is exposed.

A gate insulating film (silicon oxide film) 257 is formed on the upper surface of the semiconductor filler 216 in the grooves 226a and 226b and on the side of the grooves 226a and 226b beyond the upper surface of semiconductor filler 216.

In the area surrounded by the gate insulating film 257, there is low-resistance polysilicon with an impurity, and the polysilicon filler forms a linear gate electrode 255a in the linear groove 226a, and a ring-shaped gate electrode 255b in the ring-shaped groove 226b.

In the vicinity of the surface in the base region 233, a source region 266 of the first conductivity type is formed in a position in contact with the gate insulating film 257.

The source region 266 is formed in the base region 233 and kept from contacting the semiconductor layer 212. The source region 266 has a depth shallower than that of the base region 233.

Therefore, from the top, the gate insulating film 257 is in contact with the source region 266, the base region 233, the semiconductor layer 212, and the semiconductor filler 216.

An ohmic region 265 of the second conductivity type is formed in a position between the source regions 266 in the vicinity of the surface in the base region 233. The ohmic region 265 of the second conductivity type has a higher concentration than the base region 233.

An interlayer insulating film 263 having an opening is formed on the gate electrodes 255 and above the semiconductor filler 216 in the guard ring portions. The surface of the ohmic region 265 and the surface of the source region 266 are exposed at the bottom of the opening of the interlayer insulating film 263. A source electrode film 267 is formed on the opening of the interlayer insulating film 263 to be in contact with the ohmic region 265 and the source region 266.

The source electrode film 267 is insulated by the interlayer insulating film 263 from the gate electrodes 255a and 255b, the semiconductor layer 212, and the semiconductor filler 216 in the ring-shaped grooves $227_1$ to $227_3$. Meanwhile, the source region 266 and the ohmic region 265 are in ohmic contact.

Therefore, the base region 233 is electrically connected with the source electrode film 267 through the ohmic region 265, and a voltage applied to the source electrode film 267 is applied to the base region 233 and the source region 266.

When the metal film forming the source electrode film 267 is patterned to form the source electrode film 267, a gate pad that is not shown is formed at the same time, and the gate electrodes 255a and 255b in the grooves 226a and 226b, respectively are connected to the gate pad, so that the same voltage can be applied at a time.

The semiconductor layer 212 is formed on the surface of the semiconductor substrate 211 by epitaxial growth, and the semiconductor substrate 211 and the semiconductor layer 212 form one wafer 210.

When the semiconductor substrate 211 is of the same conductivity type as that of the semiconductor layer 212 and in a high concentration, the semiconductor substrate 211 and the electrode 270 formed on the surface thereof form an ohmic junction. In this case, the transistor device 201 operates as a MOSFET. Then, the electrode 270 formed on the back surface of the semiconductor substrate 211 serves as a drain electrode.

Assume that the first conductivity type is N-type, and the second conductivity type is P-type. The source electrode film 267 is grounded, and a positive voltage is applied to the electrode 270 to set the PN junction between the base region 233 and the semiconductor layer 212 to be in a reverse biased state. Then, when a positive voltage equal to or higher than the threshold voltage is applied to the gate electrodes 255a and 255b, an inversion layer of the first conductivity type is formed where the base region 233 is in contact with the gate insulating film 257. The source region 266 is connected to the semiconductor layer 212 by the inversion layer and attains a conductive state, so that current is passed.

The inversion layer disappears and a cutoff state is attained once the voltage applied to the gate electrodes 226a and 226b is below the threshold voltage. Then the current does not flow.

In the cutoff state, reverse biased voltage is applied between the base region 233 and the semiconductor layer 212, and a depletion layer is expanded from the base region 233. When the depletion layer reaches the semiconductor filler 216 at the bottom of the grooves 226a and 226b, a depletion layer starts to expand from the semiconductor filler 216 as well. The part of the semiconductor layer 212 positioned on the inner side of the ring-shaped groove 226b and in an equal depth to that of the grooves 226a and 226b is depleted.

If the total amount of the impurity of the first conductivity type contained in the part of the semiconductor layer 212 positioned on the inner side of the ring-shaped groove 226b and in the same depth as that of the grooves 226a and 226b, and the amount of the impurity of the second conductivity type contained in the semiconductor filler 216 at the bottom of the grooves 226a and 226b are equal, when the part positioned on the inner side of the ring-shaped groove 226b and as deep as the grooves 226a and 226b is entirely depleted, the semiconductor filler 216 present at the bottom of the grooves 226a and 226b is entirely depleted.

In this state, the electric field at the lower position of the base region 233 is uniform, and the breakdown voltage in the region provided with the base region 233 is high.

At the time, the depletion layer expands toward the guard ring portion positioned on the outer side of the grooves 226a and 226b.

The guard ring portions in the transistor device 201 according to the invention have a semiconductor filler 216 of the second conductivity type filled in the plurality of ring-shaped grooves $227_1$ to $227_3$ at least up to a height equal to or higher than the surface of the semiconductor layer 212 similarly to the diode device 1. At least the inner or/and outer circumferences are connected with a relay diffusion layer of the second conductivity type. In FIGS. 20 and 22, reference numeral 252a indicates a relay diffusion layer connected to the inner circumferential side of the innermost guard ring portion, while reference numeral 252b indicates a relay diffusion layer connected to the outer circumferential side of the guard ring portion, and reference numeral 252c indicates a relay diffusion layer provided on the inner circumferential side of the guard ring portions other than the innermost guard ring portion.

These relay diffusion layers 252a, 252b, and 252c are formed at the same time when the base region 233 is formed by diffusion, and have the same depth and the same concentration as those of the base region 233.

The relay diffusion layers 252b and 252c between the guard ring portions are kept from contacting at least one of adjacent inner side and outer side of guard ring portions. The relay diffusion layer 252a provided on the inner circumferential side of the innermost guard ring portion is kept from contacting the base region 233. The guard ring portions between each other, or the guard ring portion and the base regions 233 are kept from short-circuiting by the relay diffusion layers 252a, 252b, and 252c.

In this arrangement, the depletion layer expanded toward the guard ring portion, upon reaching the relay diffusion layer 252a connected to the inner circumferential side of the innermost guard ring portion. The depletion layer starts to expand from the innermost guard ring portion toward both the ring inner and outer sides.

The relay diffusion layer 252b connected to the outer circumference of the inner side one of the two adjacent guard ring portions, and the relay diffusion layer 252c connected with the inner circumferential side of the outer side guard ring portion are provided adjacent to each other. The distance between the region of the second conductivity type formed by the inner guard ring portion and the relay diffusion layer 252b and the region of the second conductivity type formed by the guard ring portion on the outer side thereof and the relay diffusion layer 252c is shortest between the adjacent relay diffusion layers 252b and 252c, and is half the distance between the semiconductor filler portions 216 forming the guard ring portions, in other words, is half the distance between the guard ring portions.

Therefore, the depletion layer from the inner guard ring portion expands for half the distance between the guard ring portions to reach the outer guard ring portion, and then a depletion layer expands from the outer guard ring portion toward the guard ring portion on the outer side thereof.

In this way, the depletion layers expand one after another from the inner guard ring portions to the outer guard ring portions, and the breakdown voltage increases. If the guard ring portions are provided at equal intervals and the total amount of the impurity of the second conductivity type contained in the guard ring portions and the total amount of the impurity of the first conductivity type contained in the semiconductor layer 212 positioned between the guard ring portions and for the same depth as that of the guard ring portion from the surface are equal, when the semiconductor layer 212 positioned between the guard ring portions is entirely depleted, the semiconductor fillers 216 in the guard ring portions are also entirely depleted inside, and the breakdown voltage more increases.

In the above transistor device 201, difference of the operation relating to difference conductivity types of the semiconductor substrate 211 will be described. When the semiconductor substrate 211 is the same conductivity type as that of the semiconductor layer 212, minority carriers are not injected into the semiconductor layer 212, and the time required for the state to change from the conductive state to the cutoff state is short.

When the semiconductor substrate 211 is of a conductivity type different from that of the semiconductor layer 212 (the second conductivity), the semiconductor substrate 211 serves as a collector layer and the transistor device 201 operates as an IGBT. In this case, minority carriers are injected into the semiconductor layer 212 from the collector layer when the transistor device 201 is turned on, which reduces the conduction resistance. Note, however, that the cutoff time for transition from the conduction state to the cutoff state is longer than that of the MOSFET because of the time required for the minority carriers to disappear.

Figure 23A:
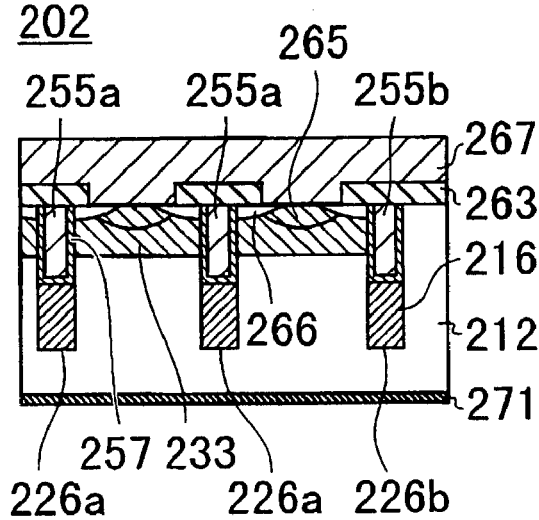
FIGS. 23a and 23b are views of a transistor device having another structure according to the invention.
Figure 23B:
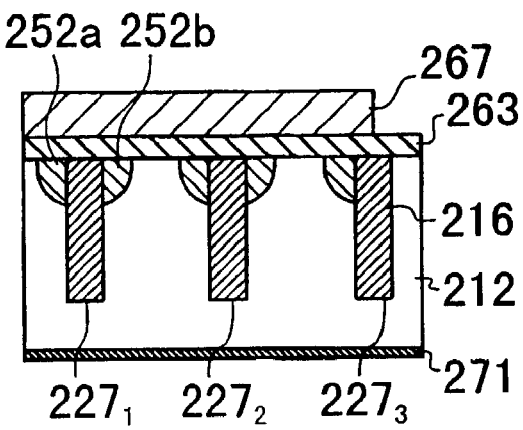

As shown in FIGS. 23(a) and 23(b), a transistor device 202 of SIGBT type comprised Schottky electrode 271 formed on the surface of the semiconductor layer 212 opposite to the surface provided with the base region 233 and the Schottky junction is formed between the Schottky electrode 271 and semiconductor layer 212, and without the semiconductor substrate 211 where the above-mentioned transistor device 201 have, is also included in the present invention. When a voltage to reverse bias a PN junction formed between the base region 233 and the semiconductor layer 212 is applied, the Schottky junction is forward biased. Therefore, minority carriers are injected into the semiconductor layer 212 from the Schottky electrode 271, when the SIGBT typed transistor device 202 is in conductive state.

Since the amount of the minority carriers of SIGBT typed transistor device is smaller than that of in the case of the IGBT, the conduction resistance can be lowered and the transition time to the cutoff state can be reduced as well.

The guard ring portions in the IGBT typed transistor device and/or the SIGBT typed transistor device have the same structure as that of the MOSFET, and the semiconductor filler 216 of the second conductivity type is filled in a plurality of ring-shaped grooves $227_1$ to $227_3$. The relay diffusion layers denoted by reference numeral 252a to 252c are contacted to the semiconductor filler 216, so that the depletion layer expanded from an inner guard ring portion to an outer guard ring portion can easily contact them.

Consequently, as described present invention, electric field concentration can be avoided, and a high breakdown voltage semiconductor device can be provided.

What is claimed is:

1. A diode device, comprising:
a semiconductor layer of a first conductivity type having a plurality of holes, said holes including ring-shaped holes and main holes provided in an inner circumference of the ring-shaped holes;
a filler made of a semiconductor of a second conductivity type filled within said holes; and
an electrode film of a material forming a Schottky junction with said semiconductor layer and an ohmic junction with said filler, wherein:
among said ring-shaped holes, concentrically provided ring-shaped holes and the filler filled within these holes form a plurality of guard ring portions,
the main holes provided in the inner circumference of the innermost ring-shaped holes and the filler filled within these main holes form withstanding voltage portions,
said electrode film is at least in contact with a surface of the semiconductor layer positioned in the inner circumference of the ring of the innermost guard ring portion and a surface of the filler in the withstanding voltage portions,
a relay diffusion layer of the second conductivity type in a depth shallower than a bottom of the ring-shaped holes formed at the surface within the semiconductor layer positioned between said guard ring portions, said relay diffusion layer is not in contact with at least one of the two guard ring portions adjacent to each other and the relay diffusion layer is held at floating potential,
depth of the plurality of holes are set equal,
intervals between the guard ring portions are set equal, and
a total amount of a first conductivity type impurity and a total amount of a second conductivity type impurity positioned on the inner side of a central line of any one of the guard ring portions are set equal, and a region of the second conductivity type impurity positioned within the inner circumference of the outermost guard ring portion is depleted, when the semiconductor layer of the first conductivity type positioned on the inner side of the outermost guard ring portion is depleted.

2. The diode device according to claim 1, wherein said relay diffusion layer in a width-wise direction of the ring of said guard ring portion is shorter than a distance between said guard ring portions adjacent to each other.

3. The diode device according to claim 1, wherein said electrode film is provided in contact with an innermost guard ring portion among said guard ring portions.

4. The diode device according to claim 1, wherein said electrode film is kept from contacting an innermost guard ring portion among said guard ring portions.

5. The diode device according to claim 1, wherein said relay diffusion layer is provided in contact with one of the inner circumference and the outer circumference of the ring of said guard ring portion.

6. The diode device according to claim 1, wherein said relay diffusion layer is kept from contacting said guard ring portions.

7. The diode device according to claim 1, wherein said ring-shaped holes include other concentric holes other than those comprising said guard ring portions and positioned between an innermost guard ring portion among said guard ring portions and said withstanding voltage portions,
said other concentric hole and a filler filling within the other concentric hole form an intermediate ring portion, and
an insulating film is provided between the electrode film and the semiconductor layer positioned between said two intermediate ring portions adjacent to each other.

8. The diode device according to claim 7, wherein said electrode film has its end extended at least to lie over said innermost guard ring portion.

9. The diode device according to claim 1, wherein the distance between the guard ring portions is equal among each other.

10. A transistor device, comprising:
a semiconductor layer of a first conductivity type having a plurality of ring-shaped holes provided concentrically at one surface of said semiconductor layer and filled with a semiconductor filler of a second conductivity type;
a base region of the second conductivity type provided in the vicinity of said one surface in said semiconductor layer and in an inner circumferential region of an innermost ring-shaped hole among the plurality of ring-shaped holes;
a source region of the first conductivity type provided in said base region;
a gate insulating film provided in contact with said base region; and
a gate electrode provided in contact with said gate insulating film, wherein:
said plurality of ring-shaped holes and said semiconductor filler of the second conductivity type filling said ring-shaped holes form a plurality of guard ring portions,
each of said guard ring portions is kept from contacting said base region,
a relay diffusion layer of the second conductivity type in a depth shallower than a bottom of said ring-shaped hole is provided between said ring-shaped holes adjacent to each other and at the surface within said semiconductor layer, and kept from contacting at least one of said ring-shaped holes adjacent to each other, depth of the plurality of holes are set equal, intervals between the guard ring portions are set equal, and a total amount of the second conductivity type impurity contained in the guard ring portions and a total amount of the first conductivity type impurity contained in the semiconductor layer positioned between the guard ring portions are set equal.

11. The transistor device according to claim 10, wherein said relay diffusion layer is provided between said innermost ring-shaped hole and said base region and kept from contacting at least one of said innermost ring-shaped hole and said base region.

12. The transistor device according to claim 10, further comprising, an ohmic layer of the same conductivity type as that of said semiconductor layer and having a higher concentration than that of said semiconductor layer provided at a surface of said semiconductor layer opposite to the surface provided with said base region, and a drain electrode film forming an ohmic junction with said ohmic layer provided at a surface of said ohmic layer.

13. The transistor device according to claim 10, further comprising, a collector layer of a conductivity type different from that of said semiconductor layer provided at a surface of said semiconductor layer opposite to the surface provided with said base region, and a collector electrode film forming an ohmic junction with said collector layer provided at a surface of said collector layer.

14. The transistor device according to claim 10, further comprising, a Schottky electrode film forming a Schottky junction with said semiconductor layer provided at a surface of said semiconductor layer opposite to the surface provided with said base region, said Schottky junction being forward biased with a voltage of a polarity that reverse biases a PN junction formed between said semiconductor layer and said base region.

* * * * *